US010454493B2

(12) United States Patent
Dempsey et al.

(10) Patent No.: US 10,454,493 B2
(45) Date of Patent: Oct. 22, 2019

(54) INTEGRATED CIRCUIT WITH ON CHIP VARIATION REDUCTION

(71) Applicant: Analog Devices Global, Hamilton (BM)

(72) Inventors: Dennis A. Dempsey, Newport (IE); Michael C. W. Coln, Lexington, MA (US)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/150,910

(22) Filed: May 10, 2016

(65) Prior Publication Data

US 2017/0331489 A1 Nov. 16, 2017

(51) Int. Cl.

*H03M 1/06* (2006.01)
*H03M 1/78* (2006.01)
*H01L 23/34* (2006.01)
*H01L 49/02* (2006.01)

(Continued)

(52) U.S. Cl.

CPC ............ *H03M 1/785* (2013.01); *H01L 23/34* (2013.01); *H01L 28/20* (2013.01); *H03F 3/45197* (2013.01); *H03F 3/45273* (2013.01); *H03M 1/06* (2013.01); *H03M 1/0612* (2013.01); *H03F 2203/45286* (2013.01); *H03M 1/74* (2013.01)

(58) Field of Classification Search

CPC ...... H03M 1/089; H03M 1/785; H03M 1/745; H03M 1/747; H03M 1/808; H03M 1/68; H03M 1/06; H03M 1/66; H03M 1/1057; H03M 1/1023

USPC .................................. 341/118–121, 144, 154

See application file for complete search history.

(56) References Cited

U.S. PATENT DOCUMENTS 4,592,002 A * 5/1986 Bozarth, Jr. .............. G06J 1/00 341/119
4,958,155 A * 9/1990 Gulczynski ......... H03M 1/1057 341/118

(Continued)

FOREIGN PATENT DOCUMENTS

WO WO-2017195025 A2 11/2017
WO WO-2017195025 A3 11/2017

OTHER PUBLICATIONS

"International Application Serial No. PCT/IB2017/000596, Invitation to Pay Add'l Fees and Partial Search Rpt dated Sep. 7, 2017", 19 pgs.

(Continued)

*Primary Examiner* — Linh V Nguyen
(74) *Attorney, Agent, or Firm* — Schwegman Lundberg & Woessner, P.A.

(57) ABSTRACT

Many electronic circuits rely on the ratio of one component to other components being well defined. Current flow in component can warm the component causing its electrical properties to change, for example the resistance of a resistor may increase due to self-heating as a result of current flow. The present disclosure provides a way to reduce temperature variation between components so as to reduce electrical mismatch between them or the consequences of such mismatch. This is important as even a change of resistance of, for example, 20-50 ppm in a resistor can result in non-linearity exceeding the least significant bit value of a 16 bit digital to analog converter.

33 Claims, 19 Drawing Sheets

Vdd
420
422
A
B
400
402
410
440
442
425
412
404
450
Vss
A B

(51) Int. Cl.
*H03F 3/45* (2006.01)
*H03M 1/74* (2006.01)

(56) References Cited

U.S. PATENT DOCUMENTS

| | | | | |
|---|---|---|---|---|
| 5,134,398 | A * | 7/1992 | Yasutake | H03M 1/089 341/119 |
| 5,424,510 | A * | 6/1995 | Gusinov | H01L 27/0823 219/209 |
| 5,790,060 | A * | 8/1998 | Tesch | H03M 1/089 341/119 |
| 5,959,657 | A | 9/1999 | Larsen et al. | |
| 6,633,246 | B1 * | 10/2003 | Bowers | H03M 1/089 341/136 |
| 6,759,975 | B1 * | 7/2004 | Lee | H03M 1/0607 341/144 |
| 6,937,178 | B1 * | 8/2005 | Rempfer | H03M 1/0678 341/144 |
| 7,057,545 | B1 * | 6/2006 | Bhattacharya | H01L 28/20 257/E21.004 |
| 7,324,031 | B1 * | 1/2008 | Lai | G11C 7/1045 341/120 |
| 7,564,385 | B2 | 7/2009 | Soude et al. | |
| 7,639,168 | B1 * | 12/2009 | Brubaker | H03M 1/0612 341/118 |
| 8,093,985 | B1 * | 1/2012 | Kumath | H03M 1/0604 338/195 |
| 2005/0052306 | A1 * | 3/2005 | Voicu | H03M 1/0678 341/154 |
| 2005/0068214 | A1 * | 3/2005 | Kim | G01K 1/02 341/144 |
| 2007/0194967 | A1 * | 8/2007 | Huang | H03K 19/0005 341/154 |
| 2008/0191917 | A1 * | 8/2008 | McClure | G01K 3/005 341/144 |
| 2008/0238747 | A1 * | 10/2008 | Moore | H03M 1/0609 341/144 |
| 2011/0226953 | A1 * | 9/2011 | Honda | G01V 8/10 250/338.3 |
| 2012/0013492 | A1 | 1/2012 | Mclachlan et al. | |

OTHER PUBLICATIONS

Highton, F.J, et al., "An 18-Bit dac for consumer applications", (1988), 4 pgs.

"International Application Serial No. PCT/IB2017/000596, International Search Report dated Nov. 8, 2017", 6 pgs.

"International Application Serial No. PCT/IB2017/000596, Written Opinion dated Nov. 8, 2017", 18 pgs.

"LTZ1000/LTZ1000A", Linear Technology Ultra Precision Reference, (1987), 1-8.

"International Application Serial No. PCT/IB2017/000596, International Preliminary Report on Patentability dated Nov. 22, 2018", 18 pgs.

* cited by examiner

INTEGRATED CIRCUIT WITH ON CHIP VARIATION REDUCTION

FIELD

The present disclosure relates to an integrated circuit that includes means to reduce inter-component variation, which may be intrinsic, due to matching error or other variances such as lot-to-lot variation or result from layout dependent effects or which result from variation in power dissipation (or heat leaking in from other components) across an array of components or a group of components formed on or within the integrated circuit. Additionally this disclosure also discloses techniques for reducing power variation as a function of output voltage.

BACKGROUND

Many modern circuits are provided in the form of integrated circuits. Integrated circuit fabrication enables components to be formed at high density and with degrees of component matching which is extremely difficult to achieve in discrete components without resorting to trimming. As a consequence integrated circuits can achieve high precision by exploiting the relative values of various components, thereby overcoming the problem that absolute values within integrated circuits may vary considerably (in the order of 10% or more) from one wafer lot to another.

The matching between components is often exploited to produce high precision or high resolution circuits. For example analog-to-digital converters (ADCs) and digital-to-analog converters (DACs) having resolution of 12 to 16 bits are available due to the ability to match components within an integrated circuit. Circuit design techniques, such as segmentation, can be used to make circuits less sensitive to inter-component variation and to allow circuits to achieve, for example, 16 bit precision without needing components to be matched to 16 bit accuracy.

However, in use, current flow in a component within an integrated circuit can cause local heating of a component which can cause it to vary in value compared to similar components.

To put this into perspective consider a 16 bit DAC. Suppose that a resistor representing the most significant bit has a value X and a first order temperature coefficient dX/dT of $50\times10^{-6}$ (50 ppm). This first order temperature coefficient is realistic as it is known to a person skilled in the art that thin film resistors typically exhibit temperature coefficients of less than 100 parts per million.

If heating of the resistor due to current flow through the resistor caused its temperature to change by 2° C. then the value of the resistor changes by a factor of $100\times10^{-6}$. Although this change sounds relatively small, it should be compared to the least significant bit size within, for example, a 16 bit DAC.

The LSB of a 16 bit DAC corresponds to a value of $(2^{-16}-1)=1.526\times10^{-5}$ of the DAC output range. Therefore the self-heating of a resistor which constitutes the most significant bit resistor could, in this example, give rise to an error of $100\times10^{-6}\div1.526\times10^{-5}=6.5$ LSB. Thus a relatively modest temperature of only 2° C. could give rise to an error in the range of 6 to 7 least significant bits (LSBs).

The self-heating also affects transistors. For example in a bipolar junction transistor the emitter current $I_E$ can be approximated by the Ebers-Moll model:

$$I_E=I_{ES}\exp((V_{BE}/V_T)-1)$$

Where $V_T=kT/q$, $I_{ES}$ is the reverse saturation current of the emitter-base junction, $V_{BE}$ is the base-emitter voltage, k is Boltzmann's constant, T is the temperature in Kelvin and q is the charge of an electron.

The temperature dependent factor within the exponential term gives rise to a real threat of current change through the transistor as a result of self-heating which might be important in differential amplifiers, comparators and current mirrors having high current multiplication ratios.

SUMMARY

The present disclosure discloses techniques to reduce the effects of local heating within circuits relying upon the matching between components. Such components may be formed within an array of components. Similarly FET transistors and other circuit elements also exhibit temperature dependent effects.

In accordance with an aspect of the present disclosure there is provided an integrated circuit having controllable heat dissipating components placed adjacent selected circuit components. The heat dissipating components are controllable so as to reduce parameter variation between selected circuit components.

A parameter may, for example, be resistance, conductance, transconductance, threshold voltage, junction voltage, where the parameter varies with temperature of a component. The disclosure herein seeks to reduce mismatch or the effects of mismatch between a pair or group of components by adjusting the relative temperature between components in the pair or group of components. The teachings herein are distinguished from devices such as temperature stabilized voltage references where a device is warmed to and maintained at a predetermined absolute temperature. The present disclosure does not relate to heating a component to a predetermined absolute temperature and holding the component steady at that temperature, which is often known as temperature stabilization or temperature regulation.

By the provision of heating components the temperature variation occurring at a part of a die adjacent a circuit component can be reduced and/or the temperature variation between a plurality of parts of a die (the parts being adjacent to or carrying respective circuit components exhibiting a temperature dependent response) can be reduced.

The heat dissipating components may be provided in the form of resistors. However the heat dissipating components may also be provided in the form of active components such as transistors or PN junctions. The heat dissipating components may be in conjunction with cooling components, for example Peltier effect devices.

The heat dissipating components may be controlled in a closed loop fashion and/or in an open loop fashion.

The control loop may be implemented in any suitable technology, such as analog electronics, digital electronics or mixed signal electronics. The control loop transfer function may be fixed or modifiable depending on the designer's choice of control strategy and implementing technology.

Closed loop control can make the temperature control system agnostic to the nature of the circuit that it is helping to stabilize against thermally induced inter-component temperature mismatch. Feedback can be achieved by fabricating temperature sensors within the semiconductor substrate of the chip, and such temperature sensors may be of any suitable technology. For example, the voltage drop across a forward biased PN junction may be used as an indication of temperature, or at least of change in temperature as the voltage drop is inversely proportional to absolute temperature, as known to the person skilled in the art. Other temperature sensing techniques, such as the provision of resistors, for example thin film resistors and poly-silicon resistors, in divider or bridge configurations may also be used to monitor for changes in the values of components. Such resistor bridge based measuring techniques may also detect changes in resistance resulting from mechanical stress (or other factors) that has been induced in an integrated circuit during its packaging process. Such stress may change the resistance of component, but the results of that stress may be mitigated by selectively heating parts of the integrated circuit to change the value or behavior of the component or other components.

Additionally or alternatively open loop control can also be implemented in response to an estimate of the temperature change or the change in an electrical parameter of the circuit component. For example the estimate of change in temperature may be made in response to an estimate of current flowing through the component together with assumptions about the thermal environment around the component, such as the response time of the component to heat up, and the heat loss between the component and the substrate that supports it. Furthermore heat transfer between adjacent components may also be modeled and estimated if such information is available. Alternatively the heat transfer between components may be measured during experiments or prototyping or may be estimated from tests performed on an operational circuit.

In some embodiments of systems and integrated circuits in accordance with the teachings of this disclosure, estimates of current flow may be performed because the system is responsive to a digital input word or because an analog value is sampled and digitized. Hence the connections at one or more circuit nodes may be defined based on knowledge of a control word applied to the system or on knowledge of the prevailing operating conditions of the system or circuit. For example, in the case of a resistor based digital-to-analog converter, the digital word to be converted sets the switch status of various switches within a resistor array. Based on knowledge of the nominal resistances, the circuit topology and potentially component layout on the die estimates of resistive heating of components can be made. The effect of the resistor self-heating can be modeled to a desired degree of accuracy and the results of that model stored in memory or encoded into a control circuit. The control circuit can then act to operate the heating elements in response to the input word.

In some instances analysis of input words to a circuit or device constituting an embodiment of this disclosure may reveal patterns that repeat with sufficient levels of certainty to make it worthwhile energizing the heating elements in advance of an arrival of an expected word (or of a change in a word) to compensate for thermal lag in transporting heat between the heating element and the component that experiences self-heating. For example the circuit may be used in an application where it responds to a signal whose time varying function is sufficiently deterministic for it to be worthwhile adding a processor to estimate the value of the signal at a given time in advance of the arrival of that signal so as to prepare the circuit by energizing at least some of the heating elements in synchronization, for example in advance, of the arrival of the signal.

In some implementing technologies the value of components may vary as a function of one or more of a differential voltage, a common mode voltage (for example in diffused resistors), ambient temperature, self-heating, heat received from neighboring components, stress (external, packaging and thermal expansion) and also as a result of electrical overstress events, or from exposure to moisture. Some of these changes may be mitigated by selective heating of a component whose performance or value has been adversely affected by one of the above causes of change, or the difference between groups of components can be reduced by selectively changing the temperature of a component within a pair of components or changing the temperatures of several components within a group of components.

In a calibration phase, a circuit may be tested to determine the ratio between several components to obtain a map of stress induced changes or mismatches. Such changes or mismatches may evolve over time as the circuit ages or as a result of its operating conditions resulting in phenomena such as charge trapping or other memory effects giving rise to component drift which may or may not be reversible. The map can then be used together with knowledge of component layout on the substrate to indicate which regions should be heated to mitigate those stress induced changes. This heating can be summed with any heating based corrections that ate needed to compensate for component variation resulting from thermal effects such as self-heating.

The disclosures and techniques disclosed herein can be used with components such as resistors and/or transistors within analog circuits, such as high precision amplifiers, comparators or other analog signal processing circuits. Time dependent variation in a component value due to heating may introduce changes in the value of that component which may manifest themselves as amplitude dependent changes in gain and/or frequency response of the circuit and hence acts as a source of distortion. Applying temperature stabilization as discussed herein can reduce the severity of such error or distortion. The temperature stabilization may be applied in a time varying manner. This can reduce the severity of the parameter change and may take account of thermal time constants. For example when a component, such as a resistor, transitions from one current flow level (which may include no current) to another current level, the temperature of the component will evolve over time in a generally asymptotic manner that can be described with a time constant. Knowing this the heaters associated with that component may be energized more strongly at switch on and then backed off so as to provide a more rapid change to the final temperature.

According to a second aspect of this disclosure there is provided a method of making the temperature within a region of an integrated circuit more homogenous by selectively applying heating to one or more portions of the region. The heating may be varied in response to direct or indirect measurements of or/and estimates of temperature across the region of the semiconductor. The heat supplied by one or more elements may be modulated in response to a control signal.

It is thus possible to reduce temperature fluctuation, or variation, between parts of an integrated circuit even though the actual change in temperature experienced by the integrated circuit may not be diminished as a whole and may even span a greater range. The relative temperature difference between components is modified to reduce mismatch or at least to reduce the impact of such mismatch or variance. The absolute temperature of a component is not a target parameter in this context.

In a further aspect, heating means may be used to reduce the change in current drawn by a combination of a circuit and the heating means in response to changes in operation of the circuit.

For example, if the circuit is a digital to analog converter, the current drawn by the digital to analog converter may vary as a function of an input word to the digital to analog converter. This change of current drawn from a supply of from a voltage reference may present a source of interference to other components and circuits operating in association with or near to the digital to analog converter. Switching current into the heating elements as the input word changes can be used to reduce the interference or electrical noise.

The interference can be reduced by two approaches.

In a first approach, the heaters are energized based on the input word to reduce the current change. Thus one or more resistors of the array of a resistor based DAC may be associated with heaters, where the heaters are operated in complement to current flow in the associated resistor or resistors such the current flow through the resistor(s) and the associated heater(s) sum to a value which varies by less than the current flow change in the resistors, and in the limit is substantially constant. The instantaneous amount of heat provided by the heaters may be modulated to take account of the time it takes for a component to transition to and settle at a new temperature.

In a second approach the timing of energization and de-energization of the heaters may be offset from that of the switch operation inside the DAC. If the offset is randomized or dithered or dynamically adjusted such that the impact of the offset can be noise shaped then the switching noise from the DAC can be spread in the frequency domain. Thus the impact of the interference or noise or other components can be reduced.

The provision of heaters within the resistor array of the DAC and around the edges of the array may cause the total current draw to be increased above the maximum current draw that would have occurred for an uncompensated array. However, by deliberately setting the resistor array within its own heat island the effects of thermal variation across the array can be reduced, both from self-heating of the array and from heat leaking in from adjacent circuits. Furthermore, since physical stress can create changes in component values which mimic those resulting from thermal effects heating may be selectively applied to or removed from parts of the array to compensate for mechanical effects as well as thermal ones. The heat island may be a portion of the substrate which is bounded by the heaters. The heat island may be delimited by one of more trenches that serve to reduce thermal conduction between the components on the heat island (e.g. the resistor array and the heaters) and other parts of the integrated circuit. The effect of heat leakage from other components can be mitigated by including a guard area around a component. The guard area may be several microns and advantageously is at least 10 μm around the component of at least one current path The heating means may be wholly or partially in the form of deliberately fabricated heating elements formed within, adjacent or around a component, or a group or array of components. Such heating elements may be in the form of resistive elements or active devices (diodes and transistors).

Other circuit components that are provided to perform other tasks may be re-purposed, or additionally purposed, to provide heat to the components that are to be compensated by heating if the circuit designer chooses to allow such other circuit components to be used in this manner.

The present disclosure also relates to an amplifier with components or other suitable sub-systems to reduce the variation in power drawn from a power supply as a function of input signal and/or output load.

In one aspect of this disclosure, the amplifier is associated with a further circuit arranged to dissipate power where the amount of power dissipated by the further circuit is relatively low when the power dissipated by the amplifier is relatively high, and the power dissipated by the further circuit is relatively high when the amount of power dissipated by the amplifier is relatively low.

"High" and "low" in this context are specific to the amplifier's operating range. Thus if the power dissipated in an amplifier varied between a few milliwatts and tens of milliwatts, then a few milliwatts would be relatively low and tens of milliwatts would be relatively high.

The various aspects of this disclosure can be used alone or in combination.

BRIEF DESCRIPTION OF THE DRAWINGS

Embodiments of integrated circuits in accordance with the teachings of this disclosure will now be described, by way of non-limiting example, with reference to the accompanying figures, in which.

DESCRIPTION OF SOME EMBODIMENTS

For the purposes of the description presented herein, terms such as left, right, to the left of, above, below and so on refer to components as shown in the appropriate figure and are not construed as referring to the positions of actual components within a device embodying this disclosure as the orientation of such a component cannot be guaranteed in use.

In order to fully explain the teachings of the present disclosure, it is useful to set out a background relating to integrated circuits having high precision resistor arrays thereon, for example as may be found in digital-to-analog converters. Such digital-to-analog converters have a multiplicity of uses and, of course, can be provided as part of analog-to-digital converters, and may be included in more complex systems such as application specific circuits, system-on-chip solutions and so on.

Figure 1A:
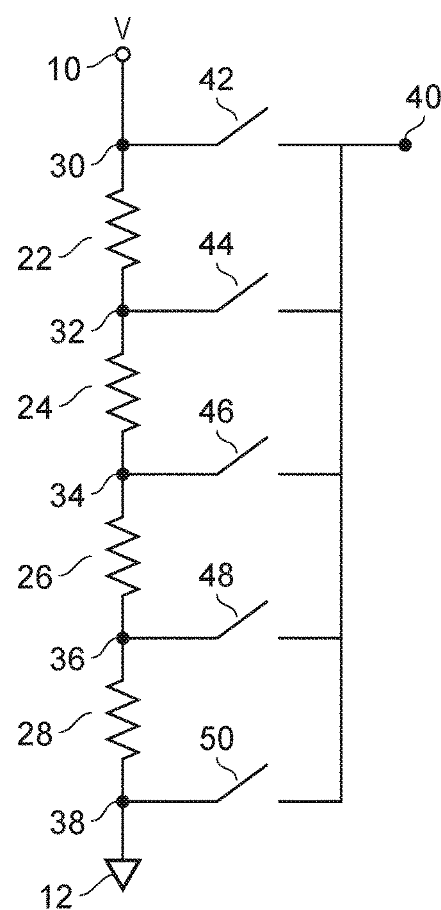
FIG. 1*a* is a circuit diagram of a first embodiment of a resistor DAC.

As shown in FIG. 1*a*, a simple form of digital-to-analog converter can be formed by connecting a plurality of resistors in series between a first voltage node 10 which may be held at a first reference voltage V1, and a second reference voltage node 12 which can be held at a second reference voltage V2, which conveniently is often zero volts (ground). A plurality of resistors, such as resistors 22, 24, 26 and 28 can be connected in series between the nodes 10 and 12. Circuit nodes can be regarded as being formed each side of the resistors, and in this example the circuit nodes are designated 30, 32, 34, 36 and 38. Electrically controlled switches are provided between the circuit nodes 30 to 38 and an output node 40. In the example shown here a first switch 42 is connected between the first node 30 and the output node 40. A second switch 44 is connected between the node 32 and the output node 40, a third switch 46 is connected between node 34 and node 40, and finally switch 48 is connected between node 36 and node 40. If only a single string of resistors are used then switches would be provided for each node, including a connection to the node 38. It can be seen that the array of resistors 22 to 28 form a potential divider and by selectively closing one of the switches 42 to 48 the voltage at an appropriate position within the potential divider can be tapped off and provided to the output node 40. Such an array of resistors is suitable for providing low resolution digital-to-analog converters, but if the number of bits were to be increased to, say, 16 bit resolution then the array would need to comprise 65536 identical resistors arranged in series. This could consume a lot space on the die. However it is also known that such a DAC can be segmented such that the output at node 40 is provided as an input voltage to a second or indeed further arrays of resistor strings. A first array of 256 resistors could provide an 8 bit resolution at node 40 and a further array of 256 resistors could then provide a further 8 bit resolution if the second array can be connected in parallel with a single one of the resistors 22 to 28.

Figure 1B:
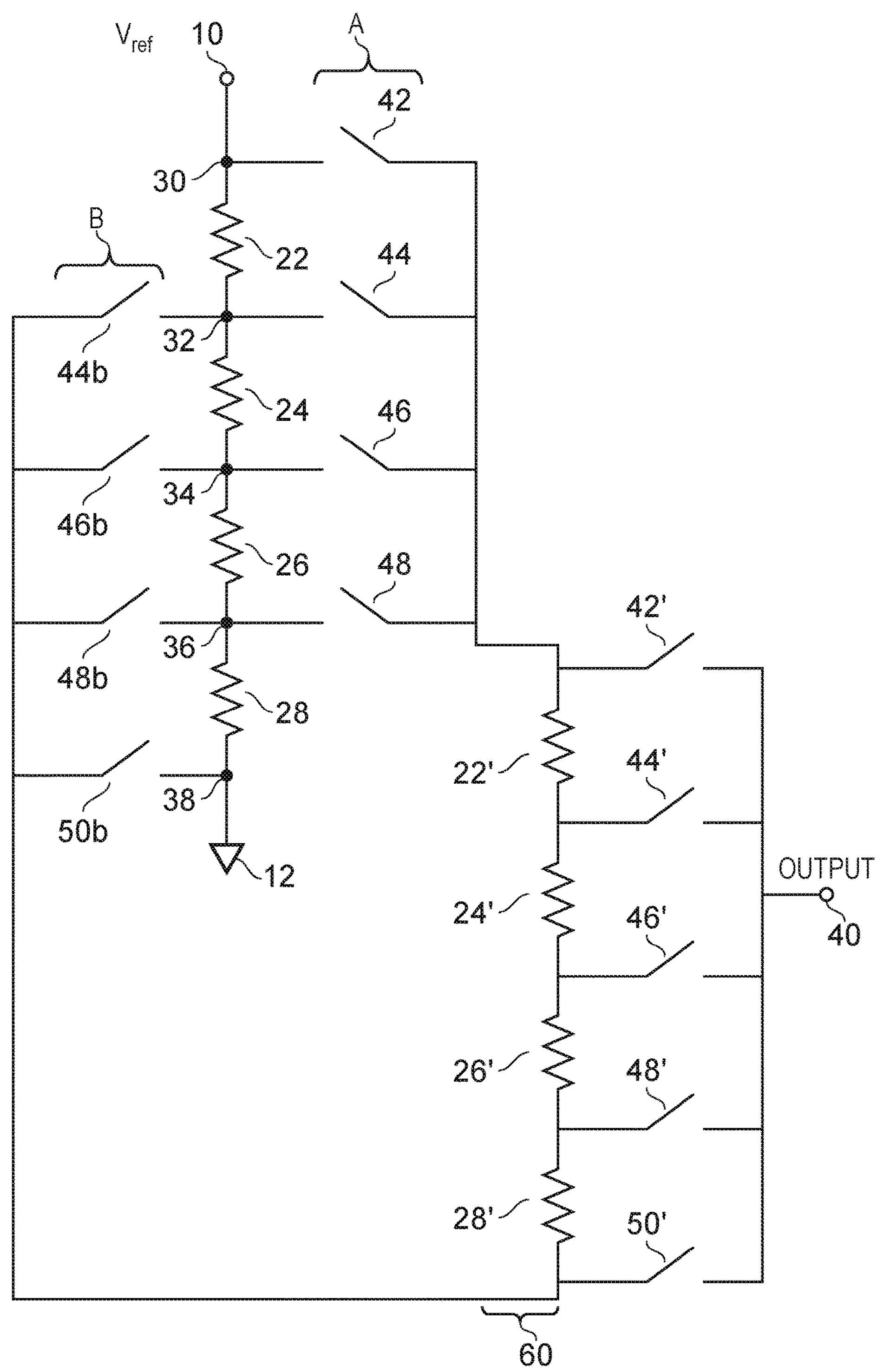
FIG. 1*b* shows a variation using segmentation.
Figure 1C:
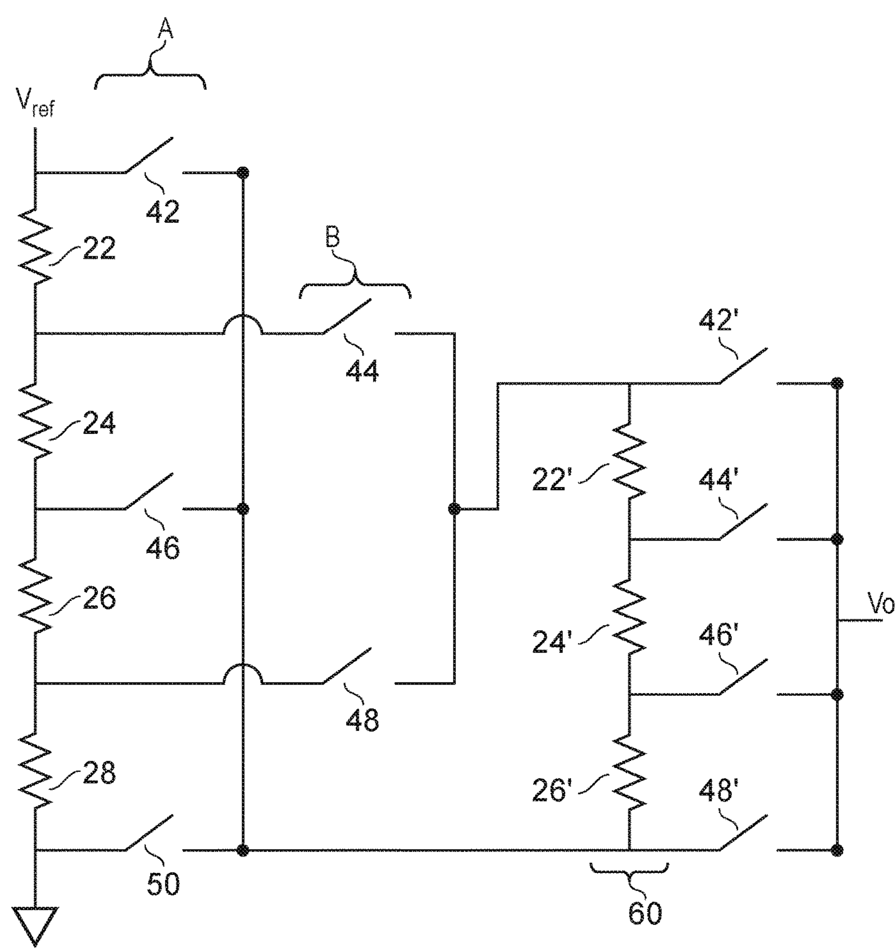
FIG. 1*c* shows a further variation of a segmented converter.

A simplified version of such a circuit is schematically illustrated in FIG. 1*b*. Here a bank of switches, generally labeled A can be operated such that one of the switches connects to one of the nodes 30, 32, 34 or 36. A bank of switches in group B is selected to be closed for the next node in the sequence. Thus if switch 44 in bank A was closed so as to connect to node 32 then switch 46*b* in bank of B would be closed so as to connect to node 34. Thus the voltage developed across one resistor would then be provided to a second string DAC, generally designated 60. The second string DAC 60 would provide the additional resolution if required. The second DAC 60 replicates the structure of the DAC shown in FIG. 1*a* with similar components being given similar designation numbers followed by apostrophe. Thus resistor 22 in the main DAC array in FIG. 1*b* is replicated as 22 in the second DAC which can be regarded as being a sub-DAC. FIG. 1*c* shows a further variation, disclosed in U.S. Pat. No. 5,959,657 where the number of switches is reduced and the sub-DAC electrically "flips over" at each transition down the string of the main DAC array.

At first sight, circuits like these would appear to be just about ideal because the current flowing from node 10 to node 12 in FIG. 1*a* is substantially independent of the output voltage provided that node 40 does not draw significant current. Similarly in the arrangement shown in FIG. 1*b* or FIG. 1*c* the current through the first string DAC and the current through the second string DAC 60 remain substantially constant. This form of circuit has some very appealing features. However, it has also got some problems. Returning to FIG. 1*a* for example, if one could look into the string DAC from node 40, then it would be apparent that the impedance from node 40 to node 10 and node 12, which may be considered as being connected together in a AC terms if the power supply is properly decoupled, varies as a function of the digital word being converted. This is undesirable if the next stage draws (or leaks) a non-negligible current at node 40 as this extra current has to be passed through the resistors of the array and hence can give rise to non-linearity, and more particularly an integral non-linearity problem within the DAC's output response. Furthermore, from a noise point of view the resistance seen by node 40 also causes the thermal noise power at that node to vary as a function of the input code. Broadly speaking it can be seen that the noise power is least when switch 42 or 48 is closed and increases when switch 44 or 46 is closed. For a much longer and bigger array, the noise power would be least when the switches at the end of the array are operated and most when the switches towards the center of the array are operated.

The same is true for the segmented arrangement shown in FIGS. 1*b* and 1*c*, except now the noise power and non-linearity has a repeating pattern as the switches run from top to bottom (or vice versa) of each array.

Taking the importance, at least in some applications, of predictable noise power into consideration, one may choose to implement a resistor DAC using the voltage mode R-2R ladder configuration. Such an arrangement is shown in FIG. 2.

Figure 2:
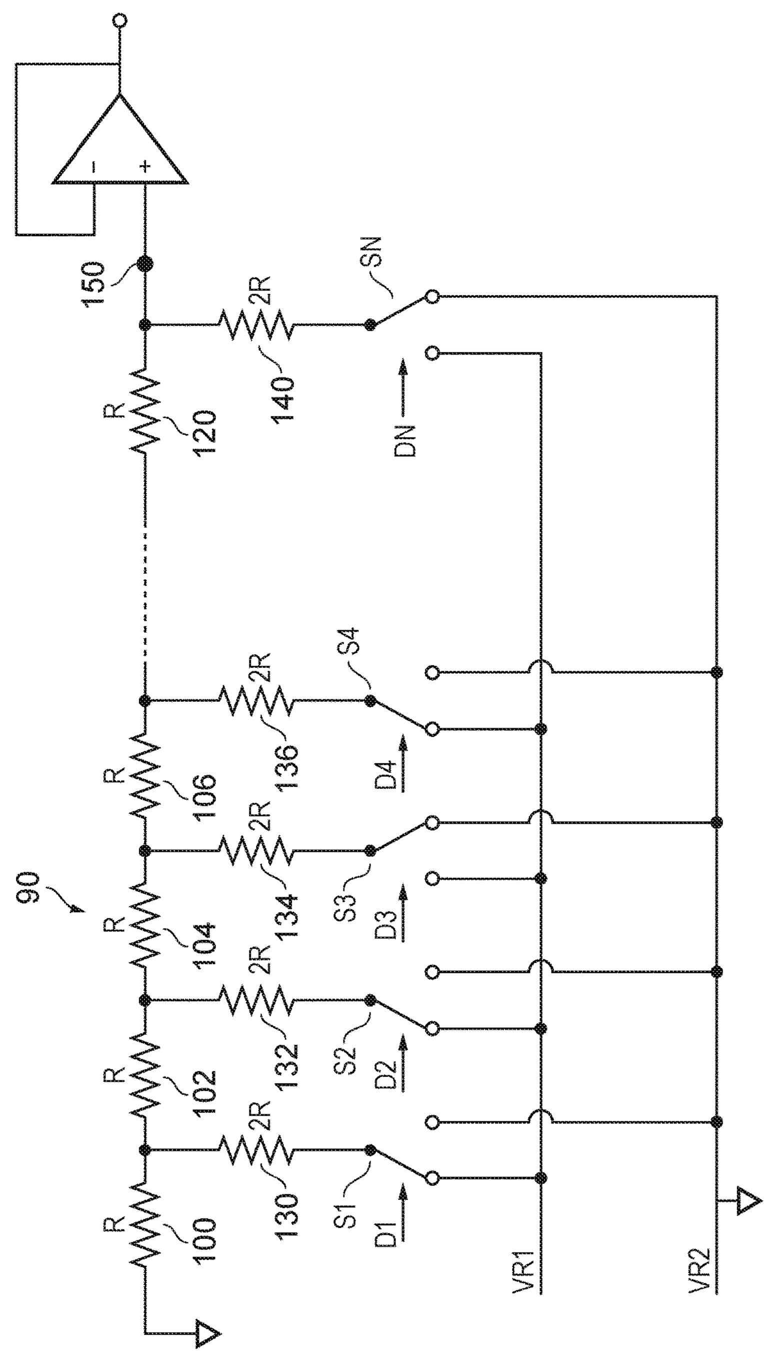
FIG. 2 is a circuit diagram of a resistor DAC employing an R-2R ladder in a voltage mode.

As shown in FIG. 2 the R-2R resistor array 90 can be considered as a string of resistors which, for simplicity, have the same value R and designated 100, 102, 104, 106 and 120, where a gap between resistors 106 and 120 is intended to represent any other number of resistors interposed there between. Each resistor 100, 102, 104, 106 and 120 has a circuit node at its right-hand side to which a resistor having a value 2R is attached. These resistors are designated 130, 132, 134, 136 and 140. Each of the 2R resistors is connected to a respective two position switch S1 to SN which is responsive to a digital control word D1 to DN. Each switch selectively connects its respective 2R resistor to either a first reference voltage VR1 or a second reference voltage VR2. Conveniently VR2 is ground although this is not necessarily the case.

The R-2R array forms a potential divider. Intuitively it can be seen that if all of the switches S1 to SN are connected to ground, then the voltage at node 150 is the ground voltage. Similarly, if all of the switches S1 to SN connect their resistors to VR1 then the voltage at node 150 is very close to VR1, only being reduced from VR1 because resistor 100 has its end tied to ground. In fact, this arrangement makes a good binary weighted DAC since the switch SN acts as the most significant bit, the next resistor down connected to switch SN−1 makes the next most significant bit and so on all the way down to S1 which acts at the least significant bit.

A further feature of this circuit configuration is that looking into the circuit from node 150 the impedance presented by the R-2R ladder is always the same. Hence the noise power of a DAC formed using a resistor R-2R ladder is invariant of the code being converted. However against that the current flowing in the resistor array is a function of the word being converted. Moreover the function is quite complex, but tractable.

Consider, for example, the situation where resistors 130, 132 and 134 are all connected to VR1. Although we don't know the actual voltages at the nodes between the resistors 100 and 102, 102 and 104, 104 and 106 (because we don't know the states of the other bits in the input word), we can see that the current flowing through resistor 130 splits into two directions and none of that current flows back through resistor 132 since the bottom ends of both resistors were at the same potential. However, if now resistor 132 is switched to ground then the current flow changes as the voltage across each of the resistors change. This change in current flow can cause self-heating of the various resistors in the array and hence their values may change. The extent to which this self-heating is important depends on where the resistor is in the array and intuitively it can be seen that self-heating in resistor 140 which is in contact with node 150 is much more significant than the effect of self-heating within the resistor 130 because any change in the value of resistor 130 would have been attenuated by the resistive divider between it and node 150. Thus, to a first order, we have traded linearity for consistency in noise power.

Figure 3:
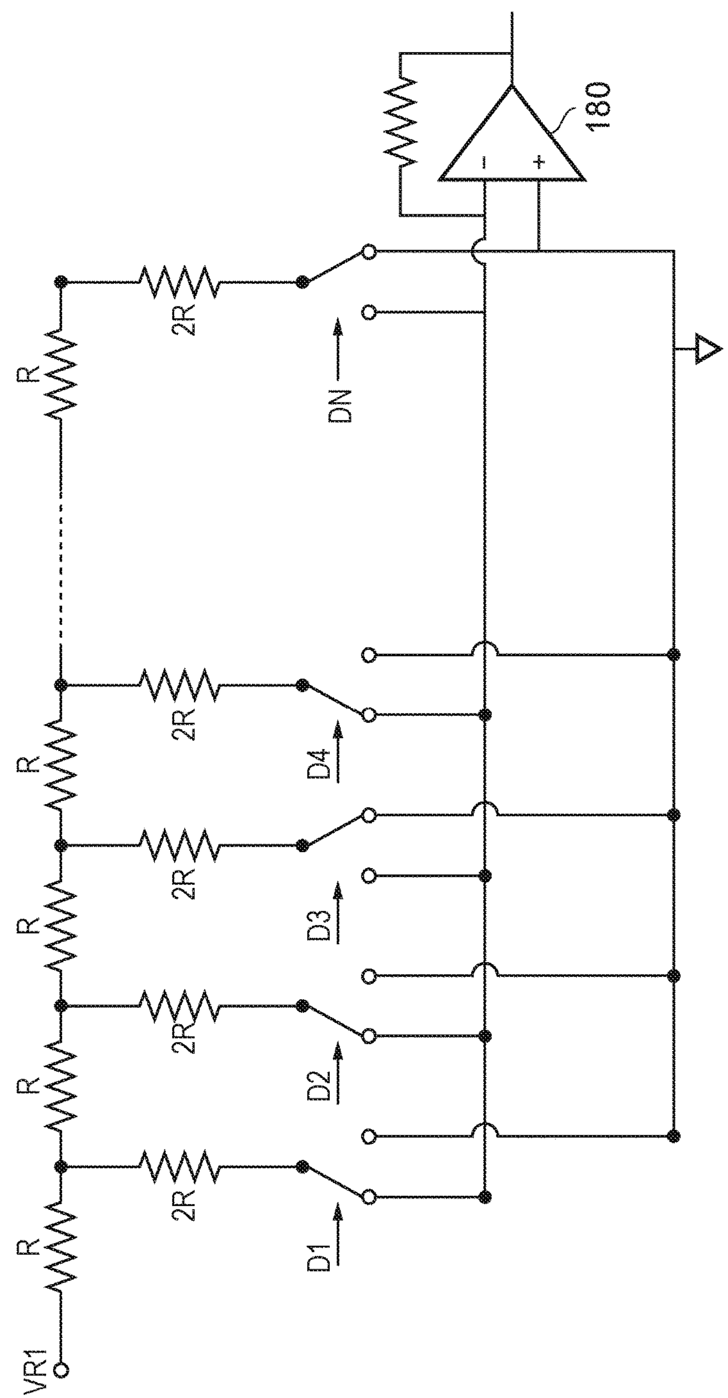
FIG. 3 shows, for completeness, an alternative variation of an R-2R based DAC using current steering techniques.

As an aside, the R-2R configuration can be used in a current steering configuration as shown in FIG. 3 where the current in each resistor can be held constant because the voltage across each resistor can be held constant by virtue of the operational amplifier 180 of FIG. 3 holding the voltages at its inverting and non-inverting inputs substantially identical to each other. However this configuration also suffers from a code dependent noise power being introduced into the output signal. It is for this reason that the circuit configuration shown in FIG. 2 can be preferred as a way of implementing a resistive digital-to-analog converter.

The resistance of a resistor, which may for example may be a thin film resistor or a doped resistor (i.e. doped semiconductor) can vary as a function of temperature, and is typically represented as a polynomial expression, e.g.

$$R=R0+TCR1\cdot(T-T0)+TCR2\cdot(T-T0)^2+\ldots$$

Where R0 is the value of the resistor at a given reference temperature T0 usually twenty five or twenty seven degrees Celsius; TCR1 is a first order temperature coefficient of resistance, TCR2 is a second order temperature coefficient of resistance.

Furthermore, to a lesser extent the resistance of thin film resistors, polysilicon resistors and doped resistors may also vary as a function of stress within the substrate and the potential that the resistor is operating at which varies as a function of the potential difference across a resistor and the common mode voltage of the resistor, especially in the case of doped resistors where the carriers can be urged to one side of the resistor by an electric field. The changes in resistance as a function of voltage or stress can, to some extent, be compensated for as if they were also resulting from a change in temperature. Resistance changes resulting from stress may need to be measured, whereas resistance changes as a function of voltage across the resistor or average voltage seen by the resistor can in principle be inferred or calculated a priori from knowledge of the circuit topology in much the same way that current flow through the resistor string of the R-2R ladder shown in FIG. 2 can also be calculated from knowledge of the circuit topology.

Figure 4:
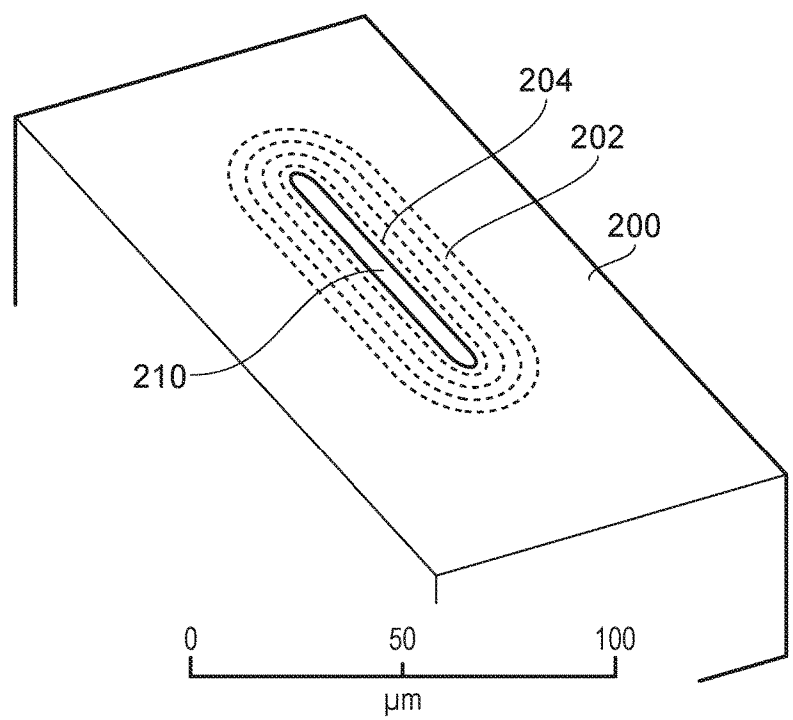
FIG. 4 schematically illustrates temperature variation modeled around a resistor on a semiconductor substrate.

FIG. 4 schematically illustrates a thermal heat map around a single thin film resistor of notional value 100 k deposited on a silicon substrate with 5V developed across the resistor. The resistor was fabricated sufficiently far from the edges of the substrate for the finite size of the substrate to be ignorable. The resistor in this example dissipates 250 μW. In simulation the substrate 200 is assumed to be at 22° C. Isotherms 202 and 204 surround the heat island 210 created by the resistor. In simulation the resistor reached a temperature of approximately 22.37° C. in zone 210, thereby exhibiting nearly 0.4° C. of temperature rise induced by current flow resulting from a 5V potential difference across the resistor.

Figure 5:
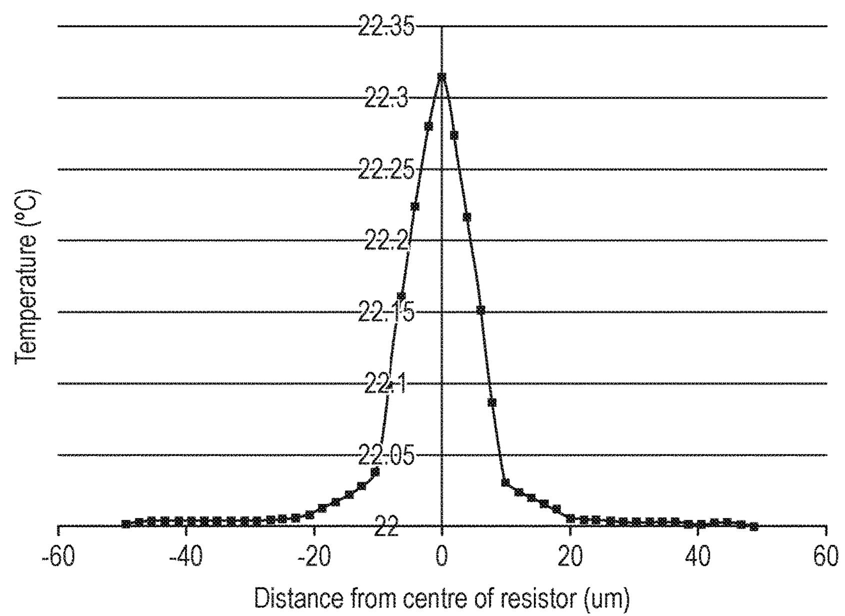
FIG. 5 is a graph showing plot of temperature versus distance from the center of a resistor as the type shown in FIG. 4.

FIG. 5 schematically shows the thermal profile as a function of distance from the center line of resistor of FIG. 4. Thus, if this resistor has a temperature coefficient of 50 parts per million, its resistance has changed by 2Ω which, while not much, in a ratio of 1 in 50,000 which is still clearly bigger than 1LSB in a 16 bit DAC.

A circuit designer can limit the temperature rise by making the resistor longer whilst maintaining its resistance unchanged. This allows the dissipated heat to be spread out over a larger area. Put simply, if the power dissipated by the resistor is invariant, but the resistor was made twice as long and it can dissipate that power into the substrate, then the temperature rise resulting from self-heating would be reduced by a factor of 2. The self-heating can be traded off against greater chip area and hence increased cost. However this trade also increases the risk of stress within the die having a greater effect on the array of resistors because they are now more spatially extensive. Thus although layout techniques are useful in terms of reducing the effect of self-heating they may not be sufficient to achieve the higher levels of accuracy which are now being demanded without incurring prohibitive costs. Furthermore increasing the size of a component can incur other undesirable consequences. For example a longer resistor can exhibit more parasitic inductance. It can also exhibit increased parasitic capacitance as a result of increased area and/or edge effects having an increased periphery of the resistor to act on.

Even assuming that the resistors are formed as a relatively elongate elements, self-heating of the resistor, and that of its neighbors can also become significant.

Figure 6:
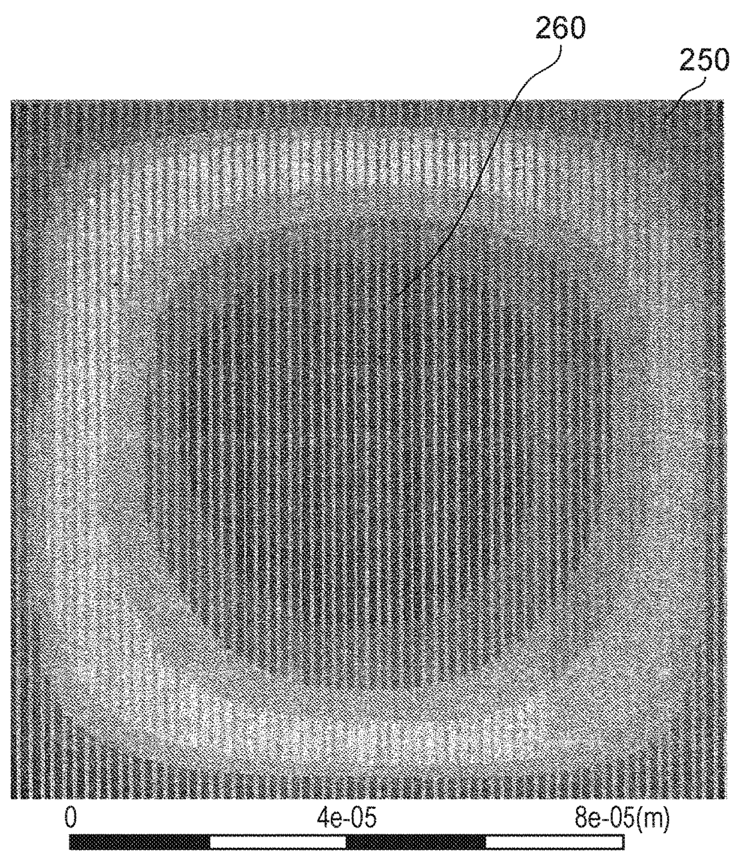
FIG. 6 is a plan view of a resistor array with temperature variation superimposed over the array.

FIG. 6 shows a simulation for an array of 64 elongate resistors formed in a square pattern over a semiconductor substrate. Each resistor in the simulation has 5V developed across it simultaneously and each resistor has the same resistance as that discussed with respect to FIGS. 4 and 5. The simulation of FIG. 6 shows the temperature profile across the array after a mere 2 ms of being powered up. The coldest parts of the array in this example are designated by region 250 around the each of the array which had a simulated temperature of 23.022° C. The hottest region designated 260 reached a temperature of 24.85° C. after only 2 ms. Thus it can now be seen that a temperature increase of substantially 1.8° C. could occur rapidly if multiple elements are simultaneously energized within a relatively small area.

Heat dissipation within the array and the temperature coefficient of the materials are substantially intrinsic to the operation of the device and whilst improved material processing or choice of materials may provide some improvements to the properties of the resistor array, this may be at the cost of making it difficult to process or may introduce some other undesirable characteristic. The inventors realized that self-heating and intra-array thermal inter-action within resistor string based DACs was more significant than the literature previously indicated, is a source of systematic error and is difficult differentiate from other code-dependent DAC linearity error sources. However, the inventors also appreciated that providing additional localized heating within the array or around the array of the resistors could be used to compensate for the effects of self-heating, for example by providing additional heat to resistors which were not undergoing much self-heating such that they would remain more matched in value to resistors that were undergoing more self-heating. Thus the temperature variation between resistive components, or indeed other components, could be reduced. This would manifest itself as reduced non-linearity in digital-to-analog converters or indeed analog circuits where gain or other circuit parameters was set by resistors and where those resistors passed a current sufficient to cause significant self-heating.

Figure 7:
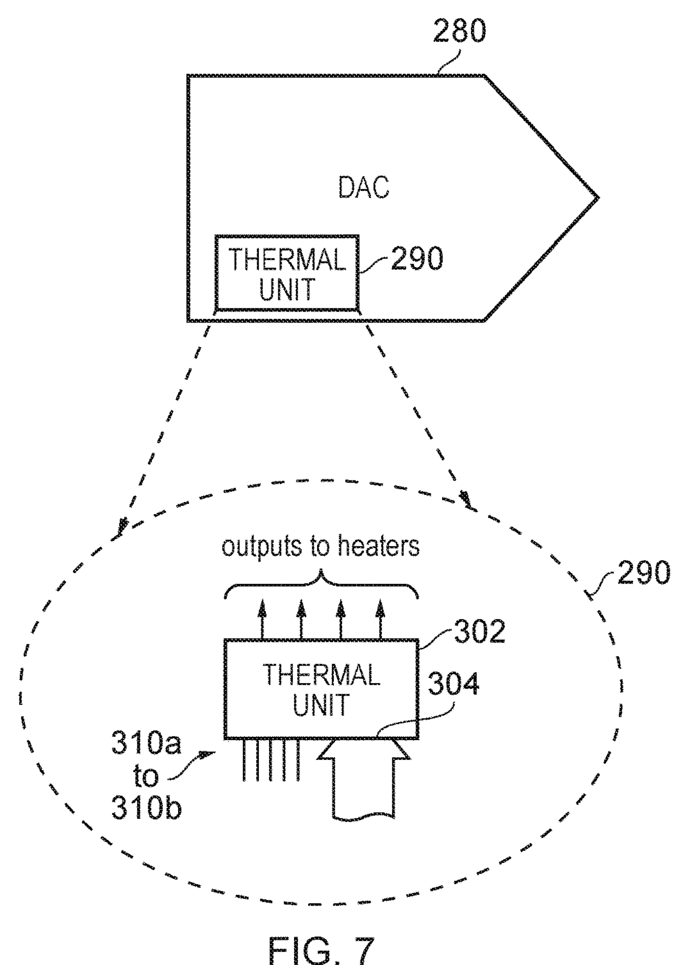
FIG. 7 is a block diagram of a digital-to-analog converter including a thermal control section in accordance with the teachings of the present disclosure.

FIG. 7 schematically illustrates a resistor string DAC 280 including a thermal compensation unit 290 in accordance with the teachings of the present disclosure. The thermal compensation unit comprises a controller 302 which has a first input 304 for receiving the digital word to be converted, or at least a redacted version of it, for example only several of the most significant bits. The controller 302 may additionally or alternatively have a plurality of inputs 310*a* to 310*n* responsive to temperature sensors, such as forward biased diodes, formed at various places within the die adjacent various ones and parts of ones of resistors in the array of the DAC. Thus the temperature sensors can act to provide a heat map to the controller 302. Based on this information the controller 302 can control the current passed by or voltage applied to a plurality of resistive heaters or other heaters positioned within the array. The controller 290 may then seek to energize one or more of a plurality of heaters as and when required, or to modulate the energy dissipated from them.

Figure 8:
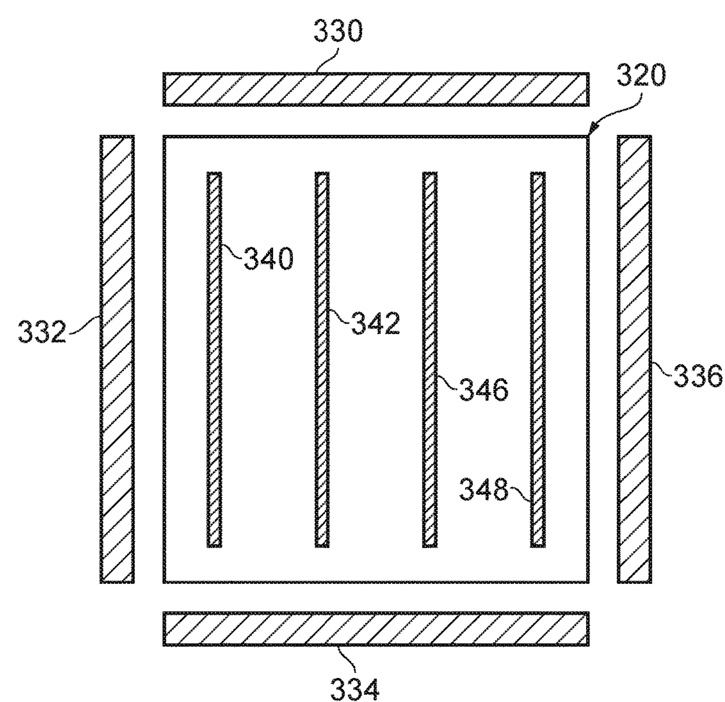
FIG. 8 shows an example arrangement of heating elements within and adjacent a region to which thermal compensation in accordance with this disclosure is applied.

FIG. 8 is a plan view of a region of a die where an array of matched components are deposited within the area designated 320. The matched components may be resistors (and possibility the switches) forming the R-2R array 90 of FIG. 2. The area 320 may be surrounded by one or more heating elements 330, 332, 334 and 336 which serve to provide heat to the edge of the array 90 in order that the temperature at the edge of the area 320 can be maintained to be more similar to that to the temperature of the middle of the array 90. Additionally or alternatively one or more heating elements 340, 342, 346 and 348 may be provided within the area 320 to provide heating as and when required in order to smooth out the temperature variation across the region 320 caused by self-heating of elements such as the resistors (not shown) within that region. The elements 340 to 348 may be provided as resistors associated with one or more of the resistors within the array 320. In the limit each functional resistor of the array 90 may be associated with its own respective heating element and they could be energized in antiphase in order to keep the heat dissipation within the region 320 substantially constant as a function of time and position such that the components tracked each other in temperature with minimal difference. The heating elements do not need to be uniformly spaced, nor do they need to be uniform themselves. Thus, if a heating element was formed as an elongate resistor lying parallel to a resistor in the array shown in FIG. 6, the heating element can be profiled to deliver more heat at its ends and less heat at its middle, so as to counteract the natural thermal profile of the array when energized.

Furthermore, a "heating element" could comprise two heating means, such as resistors or active components (such as transistors), disposed either side of a component (or around a component) to control the temperature of that component.

As noted before, dissipating extra power within the array in this way has additional benefits besides improving linearity of the array by reducing inter-component variation driven by thermal differences. This approach also has the effect of reducing the changes or variance in current drawn by the array and its heating circuit which in turn reduces cross talk introduced to other components by virtue of changes in load presented to the power supply by the array, or a component including the array such as a DAC, during its operation. The heating elements need not be driven in a binary "on-off" manner, although this approach is easiest to implement. The current through the elements may be modulated to an appropriate level by a drive transistor. Furthermore, the slew rate at which current is turned on, turned off, or varied may be limited to reduce the noise introduced by switching the heaters on and off. Additionally changes in the current flowing in the heaters may be made in response to changes in the current drawn by other components of sub-systems in an integrated circuit to reduce electrical interference.

The effect of a resistance change depends to a large extent on the DAC architecture and which resistor in the DAC, such as a ladder DAC or an R-2R DAC, is varying as a result of self-heating or other effects. A small change in the resistor at or near the least significant bit will only result in a sub-LSB change in the DAC output value, whereas a similar change in the resistor forming the most significant bit can result in several LSB's worth of output voltage charge from the DAC.

From this observation and suitable analysis of a given DAC implementation, which may include analysis of the circuit design and/or analysis of the circuit layout on the chip, it becomes apparent that most of the benefit of applying thermal compensation can be achieved by compensating the resistors associated with the most significant bits of the DAC. As a result the complexity of the compensation circuit can be much reduced as, for example, only the first 4 to 7 bits of a 16 or more bit converter need be compensated.

Figure 9A:
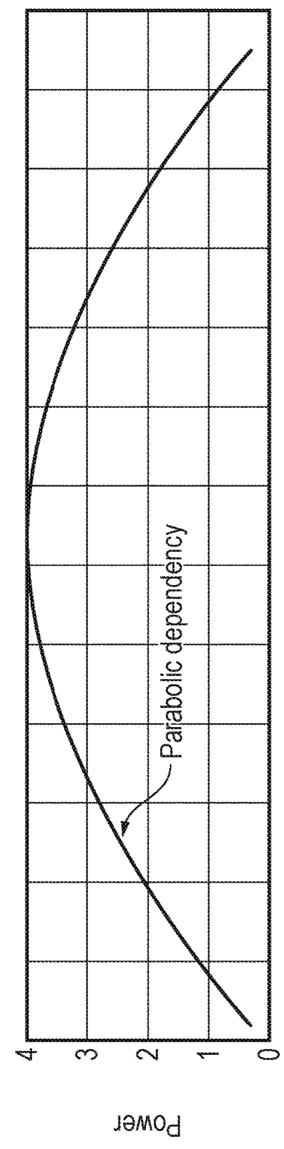
FIGS. 9*a* and 9*b* schematically show variations in dissipated power for a conventional R-2R converter and one implemented in accordance with the present disclosure.
Figure 9B:
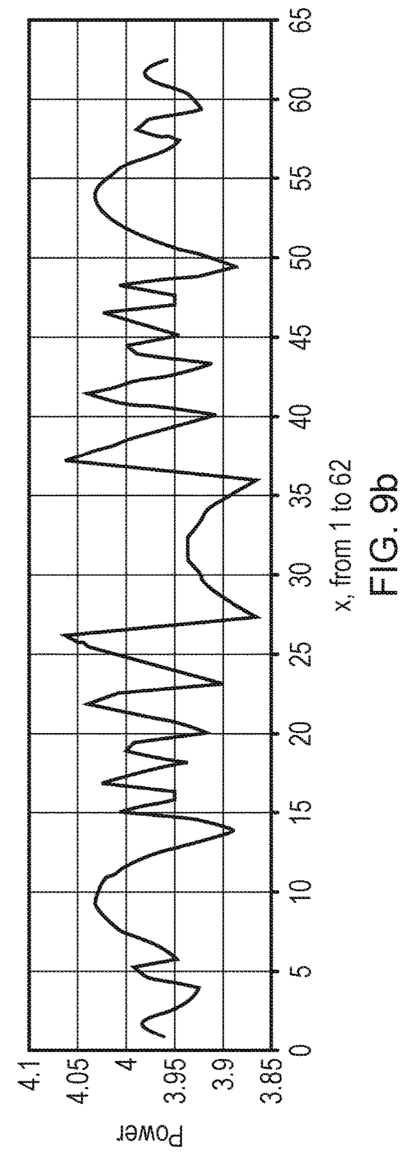

FIG. 9*a* represents the power consumption of a 6 bit segment of a digital to analog converter formed in an R-2R manner. It can be seen that there is a generally parabolic relationship between the power consumed by the 6 bit segment and the input code that it is converting. This parabolic power consumption curve is likely to be the source of the parabolic integral non-linearity error that is often observed with such DACs. FIG. 9*b* shows an equivalent power consumption curve for the combination of the R-2R DAC shown in FIG. 9*a* and an embodiment of the present invention where equivalently sized resistors form heating elements and are associated with each one of the resistors in the R-2R segment. One way of achieving this may be to take the input word for the DAC of 9*a*, add a binary value corresponding to approximately half of the bit range of the DAC, which in this example represents a binary value of 31, and then using the resulting output word (and ignoring any addition overflow when performing the calculation, which can be regarded as applying modulo arithmetic to the calculation of a heater control word) to drive the heaters. The heaters may be arranged as individual elements or they may be connected to mirror the R-2R configuration of the DAC. The resulting power consumption is shown in FIG. 9*b* which has been represented on a much larger scale, where it can be seen that the power consumption ranges between approximately 3.87 arbitrary units and 4.06 arbitrary units compared to a range of 0 to 4 arbitrary units in FIG. 9*a*. Thus the code dependent power fluctuation is much reduced, at the expense of slightly more power being consumed.

The heating elements, if provided by additional resistors, do not need to be particularly well matched to one another or to the resistors of the array. This may be exploited in order to slightly vary the length of the heating elements in order to facilitate layout on the integrated circuit die.

As noted before components can also be affected by stress and sometimes by the potential difference that they see. Although these changes in value do not result from thermal changes resulting from self-heating, they can still to some extent be corrected for by selectively applying heat to the component or to a cooperating component in order to reduce the relative parameter change (such as resistance) between them substantially matched components. An additional switching network may be provided to various nodes within the R-2R array such that the resistors therefrom can be removed from the array and set into Wheatstone bridge configurations such that during a set up phase the relative resistance of nominally identical resistors passing the same current can be determined to measure stress induced variations in component values. This information can then be passed to the controller to instruct it to form regions having excess temperature in order to compensate for stress induced variation. Similarly, regions of excess temperature can also be formed to compensate for voltage induced variation.

In use, some DACs may be set to output a given voltage and then changed relatively infrequently. They can be regarded as acting as voltage references. Thus self-heating will become established and reach a relative steady state. The control circuit can then compensate for variations resulting from the self-heating and indeed from voltages within the circuit where those voltages effect the resistance of, for example, diffused resistors. However it can be seen, for example from FIG. 6 that significant amounts of self-heating can be established within millisecond timeframes and hence the effects of self-heating is relevant to DACs operating within the Kilohertz and tens of Kilohertz ranges.

In fact, work within Analog Devices suggests that heating effects may manifest themselves in the 100 s of KHz and the MHz frequency range. As technologies move to smaller and smaller geometries the thermal time constants are decreasing and hence the settling speeds are increasing. Consequently this technique is applicable for use with a wide range of digital to analog converters operating over wide range of frequencies.

The amount of heat provided by the heaters may be varied over time following the establishment of a new current flow in, for example, the resistor array. This may be used to further linearize the response of the array or to reduce power consumption from the heaters. The amount of heat can be controlled in a time varying manner in an analog/continuous or stepped/digital manner by a suitable controller.

Using low power digital design, synthesis and implementation techniques, digital electronics may consume relatively little power even when performing complex calculations. This means that the power of quite complex digital circuitry can be harnessed to estimate the effects of self-heating of components within the array and to avoid excessive energy use by the heaters. Power consumption of the digital circuitry may also be considered in the power analysis.

Resistor self-heating can also be relevant to resistors arranged in the feedback paths of high precision amplifiers. Thus, for example, the amount of heating experienced by a resistor when responding to the peak of a substantially sinusoidal input signal may be greater than that when responding to a midpoint or trough of a signal, depending on how the amplifier circuit is biased. These variations in resistance, although small, could again introduce amounts of distortion corresponding to several LSB if the amplifier is driven by a DAC. Thus similar thermal compensation approaches may also be worthwhile in the resistor networks of amplifiers dealing with high precision signals.

The technique described here can also be used with other components. Thus, for example, there are situations where scaled or matched current sources may be switched on and off in order to provide a digitally controlled current. The current sources that are on will exhibit some degree of self-heating, whilst the current sources which are off do not. The self-heating within the current source may change the base-emitter voltage within a bipolar transistor or the gate-source voltage within a field effect transistor, where each of their transistors is used in a current mirror style configuration to set a known output current based on a known voltage supplied to their base or gate, respectively. Corresponding heating elements for each current source, which may be in the form of an equivalent current source switched in anti-phase, may be provided to reduce thermal variation between the current sources and also to smooth out the load presented to the power supply.

The teachings of the present disclosure may also be used to improve the noise performance of a DAC. As noted earlier, one way that is adopted to reduce the temperature based variation of a resistor due to self-heating is to make the resistor longer. The techniques disclosed here allow the length of the resistors to be reduced. This in turn means that the resistance of the resistors can be lower with a consequence which is well known that lower value resistors generate less thermal (Johnson) noise.

Figure 10:
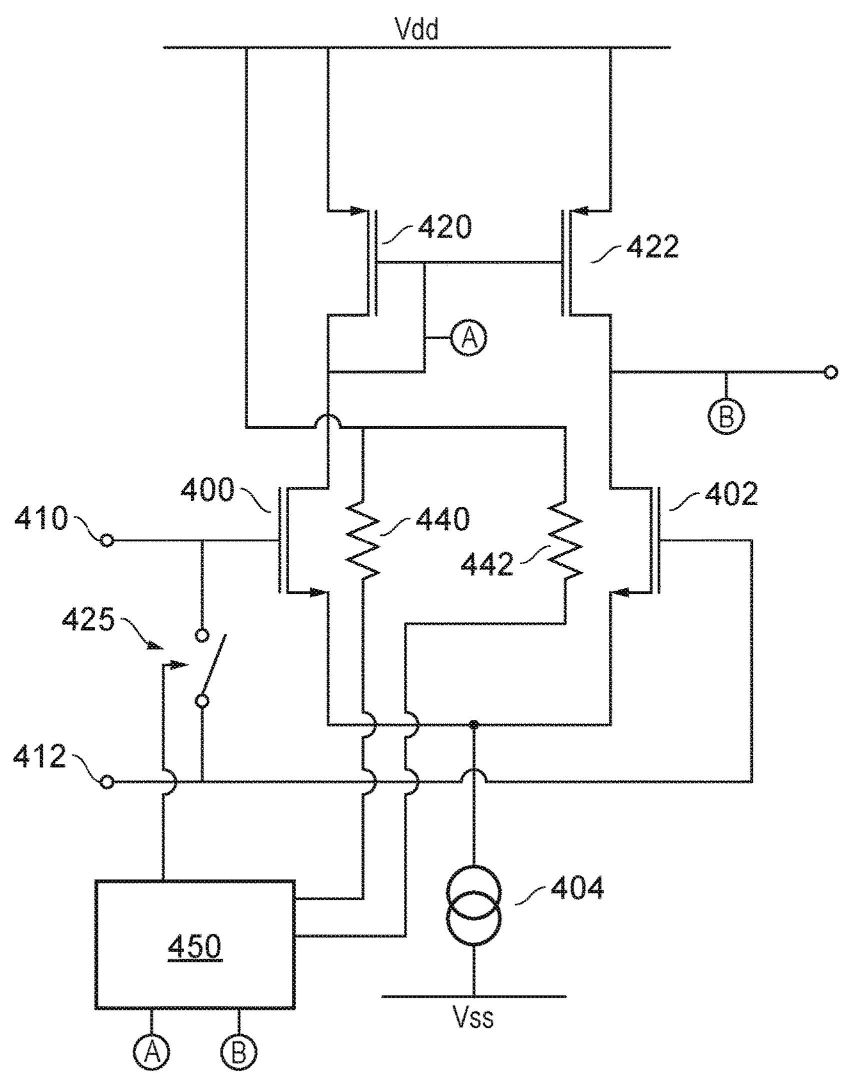
FIG. 10 illustrates a differential circuit as typically found in a comparator or in an amplifier where local heating is used to trim offsets within the differential circuit.

The use of controlled heating may also be used to trim input voltage offset performance in differential amplifiers or comparators. The input stage of a differential amplifier or a comparator generally involves a pair of matched transistors in a "long tail pair" or equivalent configuration. Such a circuit is shown in FIG. 10, where transistors 400 and 402, shown here as MOSFETs but the same configuration works equally well with JFETs and Bipolar junction transistors, have their sources connected together and to a current sink 404. A gate of the first transistor 400 is connected to a first input node 410 of the differential amplifier and the gate of the second transistor 402 is connected to the second input node 412 of the amplifier. The drains of the transistors 400 and 402 are connected to the positive supply rail Vdd by way of active loads formed by transistors 420 and 422 in a well-known configuration. If the transistors 400 and 402 are perfectly matched, then when the nodes 410 and 412 are at the same voltage (for example by closing an internal auto-zero switch 425, then the voltages at nodes A and B should be identical.

However mismatch between the transistors 400 and 402 results in a voltage difference between the voltages at nodes A and B which then gets amplified by subsequent amplification stages.

The current through a FET operating in strong inversion can be approximated as $$Id=A\cdot(Vgs-Vth)^2$$

Where: Id is the drain current, A is a constant for a given device, Vgs is the gate to source voltage and Vth is the threshold voltage.

In the Shichman-Hodges model $$V_{TN}=V_{TO}+\gamma(\sqrt{|V_{SB}+2\phi_F|}-\sqrt{|2\phi_F|})$$

Where VTN is the threshold voltage when a substrate Bias $V_{SB}$ is present. $V_{TO}$ is the threshold voltage for zero substrate bias, $\gamma$ is a variable related to oxide thickness, oxide permittivity and doping concentration and $$\phi_F=(kT/q)\ln(N_A/N_i)$$

Where k is Boltzmann's constant, T is temperature in Kelvin, $N_A$ is the doping concentration and Ni is an intrinsic doping parameter for the substrate.

From this is can be seen that threshold voltage varies with lots of parameters, one of which is temperature. In the arrangement shown in FIG. 10 heaters 440 and 442 are fabricated adjacent respective ones of the transistors 400 and 402 and can be energized by a controller 450 which is responsive to the voltage difference at nodes A and B when the gates of the input transistors are connected together.

From this is can be seen that heat leaking from other parts of the circuit to one of the transistors may affect the matching between the transistors. Similarly mismatch between the transistors can be trimmed by varying the relative threshold voltages of the transistors by preferentially warming one of them.

The compensation may also be applied to other parts of an amplifier circuit which make a significant contribution to the offset such as the input referred offset of an amplifier. Thus although the input transistors may be a significant source of offset, other circuits such as active loads associated with an amplifier stage or folded cascode circuits associated with an amplifier stage may contribute significantly (or be the dominant source) of offset.

In another aspect of this disclosure, again stemming from the realization that self-heating of resistors in a resistive analog to digital converter is a source of error in the output voltage, a model of the resistor array may be formed and made available to a processor, whether that be by way of software, or firmware, acting on a programmable data processor, or by way of hardware. The model can receive an input word and estimate an error resulting from self-heating of the resistor array. Having estimated the error, the model may apply a correction to the word presented to the DAC to reduce the error, i.e. the difference between the ideal output voltage and the actual output voltage. This approach can be used as a standalone approach to correcting for errors resulting from self-heating, or it may be used in combination with the approach described herein before of selectively heating parts of the array to mitigate the effects of self-heating.

Where heating elements are provided as resistors, such heating elements may be provided in the same layer of the integrated circuit as the resistors of, for example, the digital to analog converter. However this is not a strict requirement and as multilayer processing is available. The heating elements may be formed in different layer such that they are vertically disposed with respect to, but adjacent, the DAC resistors which they are thermally compensating. The heating elements may also be formed in an active semiconductor layer provided within the substrate. Transistors and/or diodes may be formed such that the combination of the current flowing through them and the voltage drop across them provides heating to compensate for self-heating of a current carrying component.

In some instances, it may be difficult to thermally adjust component values to reduce mismatch between components. However in some circuits (depending on topology) heating may be applied to increase the amount of mismatch between selected components, but the changes may still reduce the effect of the mismatch at the output of the circuit.

A DAC is often connected to a buffer such that a load can be driven to a desired DAC output voltage without compromising the operation of the DAC. The buffer is often integrated within the DAC. The operation of such a buffer will now be considered in greater detail.

Figure 11:
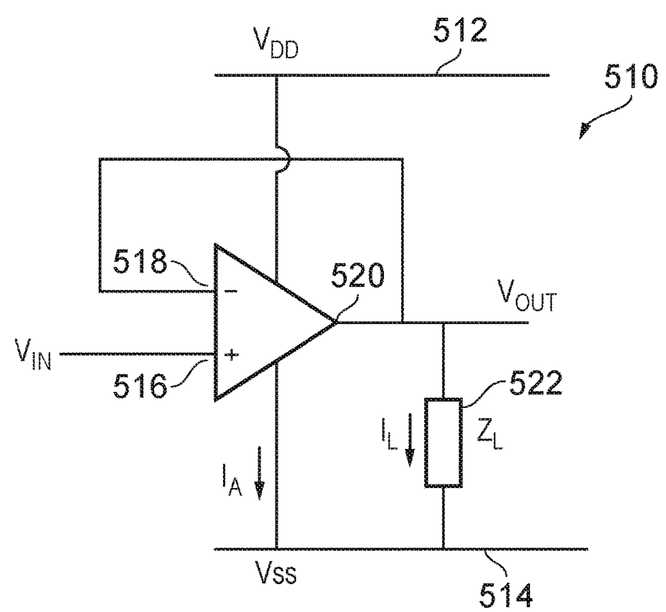
FIG. 11 is a circuit diagram of a prior art buffer amplifier configuration in order to discuss the problems of variable power dissipation and self-heating of the buffer.

FIG. 11 shows a non-inverting amplifier 510 connected between first and second power rails 512 and 514 providing supply voltages Vdd and Vss. Vss may be at zero volts but this is not a requirement. The amplifier 510 has, in this example, a high impedance non inverting input 516 arranged to receive an input voltage Vin, for example from a DAC. The output voltage Vout tracks Vin as the amplifier 510 is configured as a unity gain buffer by virtue of having the output voltage directly fed back, or coupled, to the inverting input 518. An output terminal 520 of the amplifier provides current to a load 522 having a load impedance $Z_L$ coupled to Vss and which for convenience will be considered to be a mainly resistive load such that any reactive impedance is negligible such that the load can be represented as $R_L$. In any event, reactive components are not dissipative.

The power dissipated by the amplifier circuit 510 can be written as $$P=P\text{amp}+P\text{load}.$$

Where Pamp represents the power dissipated in the amplifier and Pload represents the power dissipated in the load $$P\text{load}=(V\text{out}-Vss)^2/R_L.$$

The power dissipated in the amplifier can be broken into a constant part Pamp(internal) and a load dependent part Pamp(load). Pamp(internal) is normally a function of the bias currents within the amplifier and may have relatively modest temperature dependence, although designers may choose to implement other temperature dependencies such as proportional to absolute temperature dependencies if they so wish. However it is worthwhile considering how the dissipation within the amplifier might also vary with the load.

Figure 12:
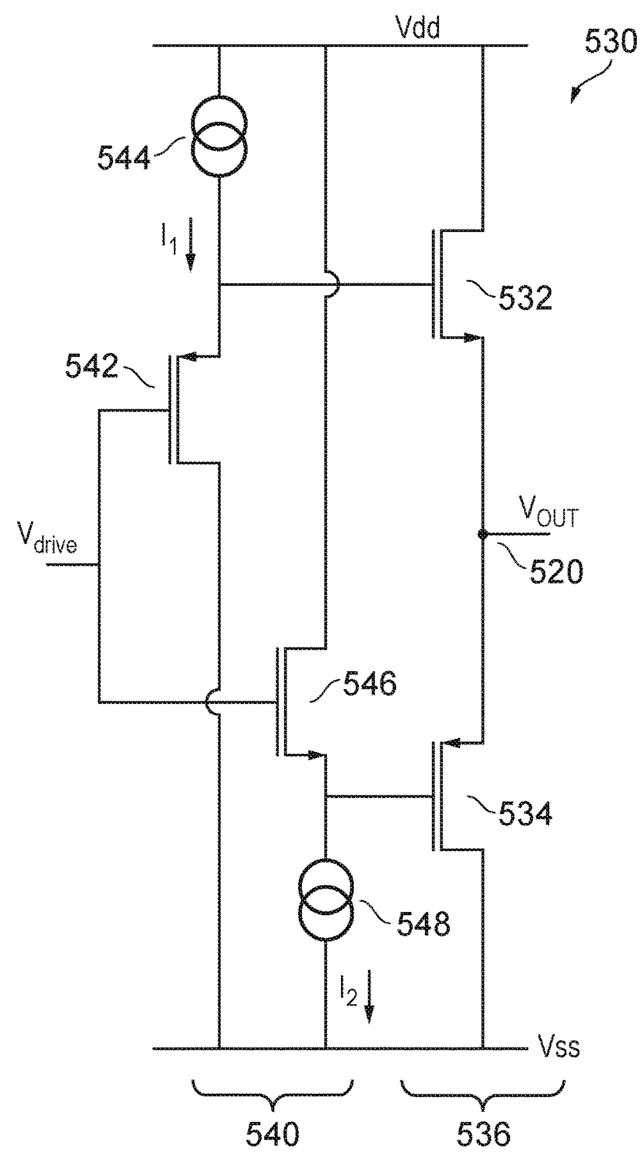
FIG. 12 is a schematic diagram of a typical amplifier output stage and level shift circuit.

FIG. 12 is a schematic diagram of a reasonably common form of operational amplifier output stage. The output stage comprises stacked transistors 532 and 534 in a totem-pole configuration 536. The transistor 532 is an N type FET having its drain connected to Vdd and its source connected to the output node 520 of the amplifier. Transistor 532 acts as a voltage follower and is able to source current to pull the output voltage up towards Vdd. Transistor 534 is a P type FET having its drain connected to Vss and its source connected to the output node 520. Transistor 534 is also in a voltage follower configuration and acts to sink current so as to pull the voltage at the output node 520 down towards Vss. Each transistor has a gate to source voltage Vgs when conducting, and for the output stage to work properly an input voltage must be translated to a suitable gate voltage for the N type transistor 532 and a suitable gate voltage for the P type transistor 534. This is performed by a voltage translation circuit 540 which takes an input voltage, Vdrive, from a preceding stage (not shown) of the amplifier and supplies the voltage to two voltage followers whose gate-source voltages nominally match in magnitude but are opposite in sign to those of the transistors 532 and 534. In this example the drive signal for the N type transistor is provided by a P type transistor 542 acting as a voltage follower, where the gate of the P type transistor 542 receives the drive voltage Vdrive, a source of the transistor 542 is connected to the gate of the transistor 532 and also to a current source 544. A drain of the transistor 542 is connected to Vss. Additional devices may be added in series with the transistors 532 and 534 to limit the current through the transistors or the voltage across the transistors so as provide protection against short circuit events.

It can be seen that the voltage of the source of the P type transistor 542 is at Vdrive+V(542) where V(542) is the gate to source voltage of the P type transistor 542 when passing the current I1 provided by the current source. It can also be seen that the voltage at the source of the N type output stage transistor 532 is lower than the voltage at its gate by a voltage V(532) which is the voltage dropped by the transistor 532 when acting as a voltage follower. Consequently $$Vout=Vdrive+V(542)-V(532)$$

If V(542) and V(532) are matched then Vout=Vdrive

A corresponding voltage shifting circuit comprising an N-type transistor 546 having its drain connected to Vdd, its gate connected to receive Vdrive and its source connected to the gate of the P type output stage FET 534 and to a current sink 548 is provided to drive the transistor 534.

If we assume that the transistors 532 and 534 are properly arranged such that a small current flows along a quiescent path from Vdd to Vss via both of transistors 532 and 534, then the majority of the current flow is though whichever of the transistors is conducting the load current.

Suppose that, as shown in FIG. 11, the amplifier is supplying a load current $I_L$, and has an output voltage Vout, then if follows that the voltage dropped across the transistor 532 is Vdd−Vout and consequently the load dependent energy dissipated within the transistor 532 is Iout*(Vdd−Vout). Iout is equal to $I_L$ for the non-inverting amplifier of FIG. 11.

We may quite reasonably assume that the current drawn in the stages that precede the totem-pole output stage is desirably substantially constant and that for the current drawn by the amplifier in an unloaded state is $I_A$.

Consequently the internal power dissipation of the amplifier is $$P\_int=(Vdd-Vss)I_A+(Vdd-Vout)Iout$$

$$P\_int=(Vdd-Vss)I_A+(Vdd-Vout)Vout/R_L$$

A consequence of this is that the variable amount of heating within the amplifier output stage may cause the gate-to-source voltages of the output transistors to vary depending on the load current they are passing. This may be undesirable as it may affect the quiescent current drawn by an output stage due to interactions between the output stage transistors. Furthermore where the amplifiers are used to buffer components such as voltage references including high accuracy digital to analog converters, the drift resulting from warming of the transistors may introduce a significant voltage error e.g. corresponding to several least significant bits of the DAC output value. This may become more apparent where several buffers are provided as matched components in a package but where they may be driving individual loads.

Additionally the value of the load resistor $R_L$ may vary as a function of the amount of power being dissipated by the load resistor $R_L$. The load may be non-linear and in some circuits may be an active load sourcing or sinking a current.

Figure 13:
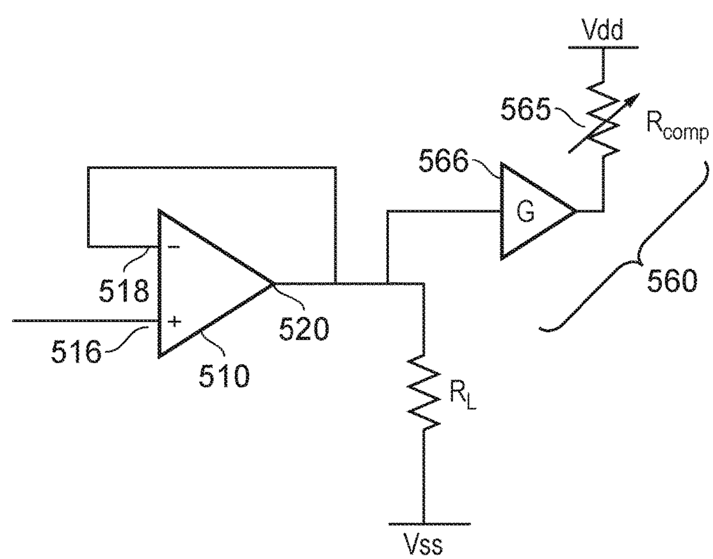
FIG. 13 is a circuit diagram of a non-inverting amplifier in accordance with an embodiment of this disclosure.

FIG. 13 is a circuit diagram of an amplifier of the type shown in FIG. 11 further comprising a power compensation circuit 560 that acts to reduce, and in the limit substantially eliminate, the change in power dissipation resulting from the changing internal dissipation within the amplifier and/or the changing dissipation within the load impedance $R_L$. The further circuit comprises at least one heat dissipating component, and optionally a driver circuit 566 for the heat dissipating component(s). The heat dissipating component may, as shown in FIG. 13, be a resistor 565, which may be a variable resistor. However diodes or transistors are other suitable examples of heat dissipating components. The heat dissipating component may be driven by a driver circuit 566. The driver circuit 566 may, for example, be an amplifier having a gain G. Thus the circuit shown in FIG. 13 is an analog circuit for reducing the variation in power dissipation. However, if for example the amplifier 510 is an output buffer of a DAC, then the DAC input word may also be supplied wholly or in part to a digitally implemented compensation circuit where the compensation circuit takes the input word and uses a further DAC to control the amount of heat dissipated by the heat dissipating component 565.

In the example shown in FIG. 13 the resistor 565 has a first end connected to Vdd and a second end connected to an amplifier 566 which may have a gain G. However for simplicity in this example the amplifier has a gain of unity. In which case it can be seen that the second end of the resistor 565 is held at voltage Vout.

The heat dissipated by the resistor 565 is $$Pcomp=(Vdd-Vout)^2/Rcomp.$$

The heat dissipated by the load resistor $R_L$ is $$Pload=(Vout-Vss)^2/R_L$$

From this it can be seen that since the voltages across the resistors $R_{comp}$ and $R_L$ sum to a constant. If $R_{comp}=R_L$ the power dissipated as a whole becomes more uniform but does not become constant. This is because of the squared term in the equation for power dissipation, which can be illustrated with an numerical example. Suppose that Vdd=10V and that for the purpose of examining the power dissipation we consider the power dissipation when Vout takes the values 0, 2, 5, 7 and 10V with $R_L=R_{comp}$=1000 Ohms. The results are tabulated below:

| Vout, | load dissipation, | compensation dissipation, | Total (Watts) |
|---|---|---|---|
| 0 | $0^2/1000 = 0$, | $(10-0)^2/1000 = 0.100$, | 0.1 |
| 2 | $2^2/1000 = 0.004$ | $(10-2)^2/1000 = 0.064$ | 0.068 |
| 5 | $5^2/1000 = 0.025$ | $(10-5)^2/1000 = 0.025$ | 0.050 |
| 7 | $7^2/1000 = 0.049$ | $(10-7)^2/1000 = 0.009$ | 0.058 |
| 10 | $10^2/1000 = 0.100$ | $(10-10)^2/1000 = 0$ | 0.1 |

It can be seen that the total power dissipated by the combination of the load resistor and the compensation resistor is not linear and has a generally parabolic form centred on the middle of the voltage range of the supply. The designer could choose to live with this, or could take steps to mitigate it. One approach to mitigating it is to provide a variable compensation resistor. The resistance of the resistor could be varied as a function of Vout, with the value of the compensation resistor being increased by a factor of 3 at Vout=5V compared to its value at Vout=0 or 10 in the above example. The compensation resistor may be formed from a digitally controllable resistor, or by a bank of resistors driven by respective comparators that selectively enable or disable current flow to respective resistors. Another approach is make the amplifier 566 non-linear and to have if form a difference between Vout and, for example, the midpoint voltage, the difference voltage could then be squared. Furthermore the end of the compensation resistor could be connected between the difference amplifier (or the squarer) and a further node which could be at a further node voltage which could be defined by the output stages of a further amplifier holding the further node at a voltage such as the mid-point voltage or a further voltage derived from a further DAC which can provide a variable voltage to control the power being dissipated in the compensation resistor.

When implementing these additional steps to mitigate the quadratic response of the power dissipation characteristic, the designer could choose to implement an open loop control strategy if the value of the load resistor is known. The controller may then set the value of the compensation resistor based on the digital word being converted by the DAC and an assumed output impedance of the load. Additionally or alternatively, circuitry may be included to measure the current through the load and the voltage across the load such that the amount of power dissipated by the compensation resistor (or equivalent dissipative component) can be controlled to reduce the overall power variation as a function of code supplied to the DAC.

Additionally if the output transistors of the buffer 566 in a totem-pole configuration like that shown in FIG. 12 and are placed on the die such that the high side transistor of the buffer 566 is close to the high side transistor 532 then the amount of power dissipated by that pair of transistors is substantially constant. Similarly if the low side transistors are placed near each other, then that pair also exhibits substantially uniform power dissipation.

As noted earlier, it is advantageous (but not necessary) for the compensation resistor to be adjustable. To achieve this digitally adjustable resistors may be used, examples of which are available from Analog Devices under the trade mark "DIGIPOT". Alternatively the designer may choose to keep the impedance ratio between the load resistor and the compensation resistor matched to within design limits set by the designer based on knowledge of the circuit's use. Some circuits act to force a voltage and measure a current, or force a current and measure a voltage (for example test equipment), and consequently the load power is known to the circuit. In these situations that knowledge can be passed to heating devices, as discussed later.

Figure 14:
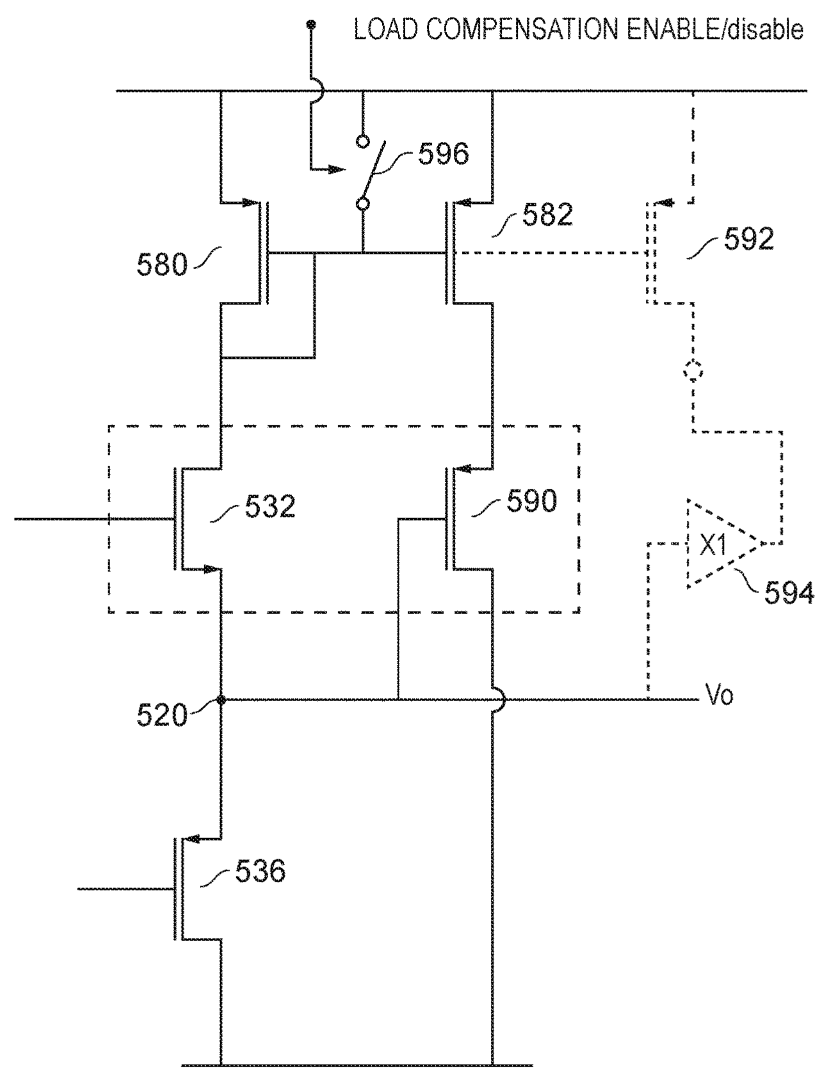
FIG. 14 is a circuit diagram of a further embodiment of this disclosure.

As mentioned earlier, the heat dissipating component component(s) need not be purely resistive. FIG. 14 shows an approach to compensating for the internal dissipation within the amplifier based on inferring the current drawn by the load.

As was the case in FIG. 12, the output stage of the buffer comprises transistors 532 and 536 in a stacked or totem pole arrangement. A current mirror formed by a first current mirror transistor, here shown as a P type FET 580 (but equally a bipolar transistor could have been used) is inserted into the current flow path in a diode connected configuration and the gate of the transistor 580 is connected to the gate of a second current mirror transistor 582 which is also P type such that the transistors 580 and 582 form a current mirror where the current passed by the transistor 582 is proportional to the current flowing though the transistor 580 as set by a current mirror scaling factor. The scaling factor is set by the circuit designer and need not be unity. However, in this example we shall for simplicity assume that the scaling factor is unity such that the same current flows in each transistor 580 and 582. Other current mirror configurations are possible which can exhibit lower voltage drops or higher output impedance, and may be used in accordance with the teachings of this disclosure.

A drain of the second current mirror transistor 582 is connected to a source of P type transistor 590 which takes the role of the heat dissipating device and which can be formed close to transistor 532 such that they thermally couple with each other so form a self-defined heat island where the temperature is not set to a predetermined value but nevertheless is, in use, roughly stable or slowly changing compared to circuits not including a temperature stabilization teachings of this disclosure. The drain of the transistor 590 is connected to Vss and the gate of the transistor 590 is connected to the output node 520. It can be seen that the voltage dropped across the transistor 590 is relatively large when Vout is high. This contrasts with the voltage across the output stage transistor 532 which is relatively low when Vout is relatively high. The converse also applies. Since both transistors 532 and 590 pass the same current, or at least the currents are related, the change in dissipation within the amplifier as a function of input voltage is decreased.

A further current mirror transistor 592, shown in phantom, may be provided to replicate the dissipation across $R_L$ if its drain is held at Vout, for example by being connected to a buffer amplifier 594 or a suitably configured voltage follower. Similar components may be provided in association with the pull down transistor 536. The transistor 592 takes the place of the compensation resistor.

It may be desirable to selectively enable or disable the current mirror and this can be achieved by configuring a switch 596, for example in the form of a P-type FET which can pull the gate of the transistor 580 to Vss thereby turning the current mirror off and simultaneously passing the output stage current to the transistor 580. Transistor 590 may also be associated with a switch or switches to make it non-conducting if the load compensation circuit is to be disabled.

Figure 15A:
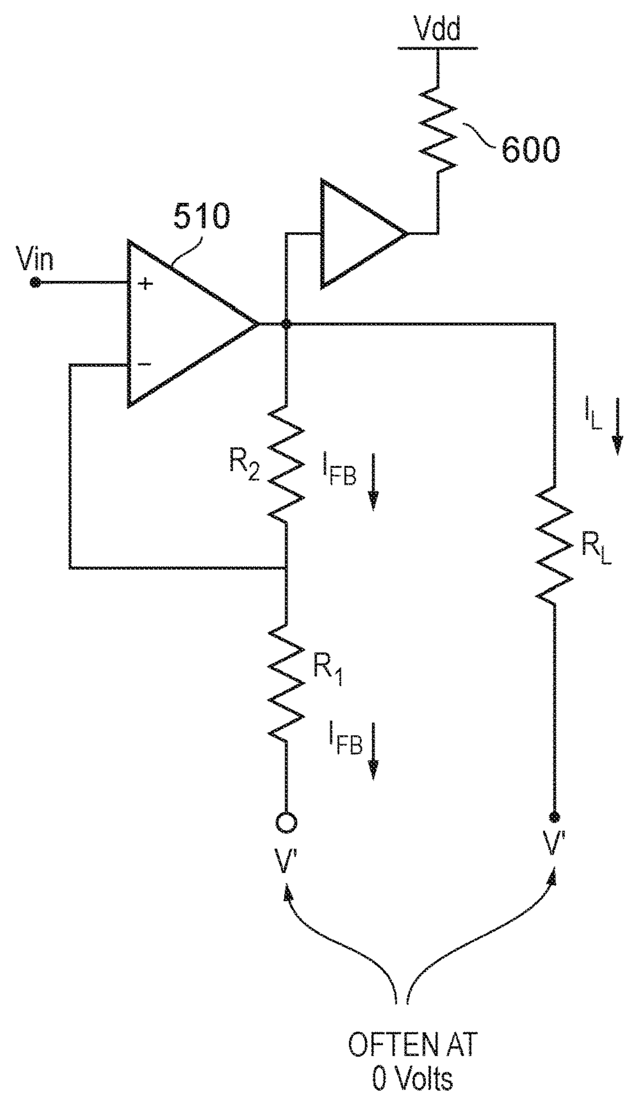
FIG. 15*a* is a circuit diagram of a non-inverting amplifier in conjunction with a dissipation compensation circuit and constituting a further embodiment of this disclosure.
Figure 15B:
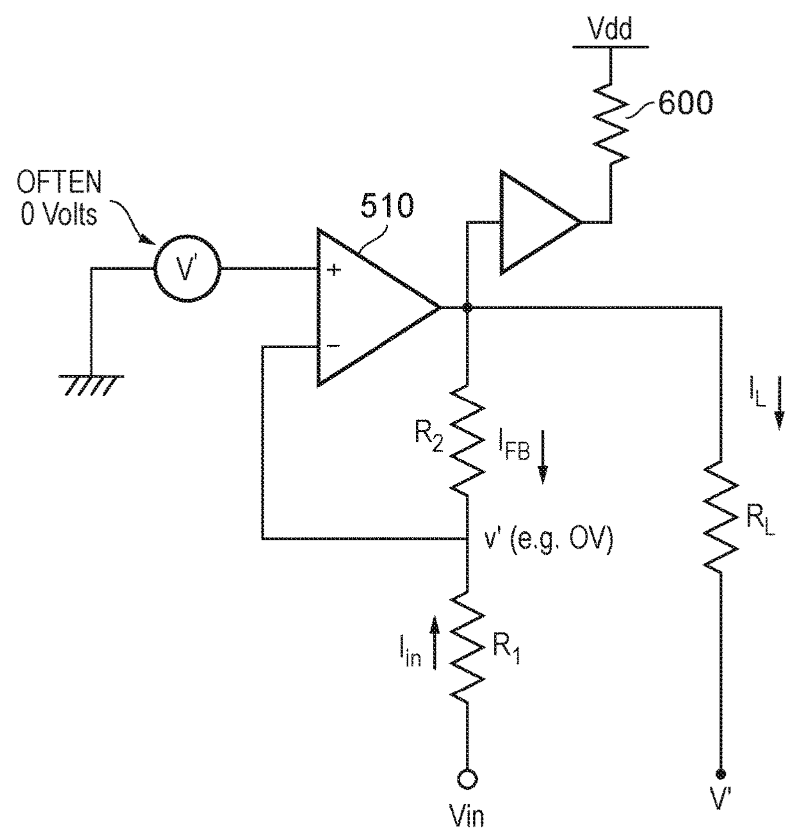
FIG. 15*b* is a circuit diagram of an inverting amplifier in conjunction with a dissipation compensation circuit and constituting a further embodiment of this disclosure.

The circuits presented herein have been based around non-inverting unity gain buffer amplifiers and hence no current was required by the feedback path. This is not the case with non-inverting amplifiers having their gain set by a potential divider, as shown in FIG. 15*a*. Similarly this is not the case with inverting amplifiers where the amplifier behaves as if the input resistor R1 is connected between the input node at a voltage Vin and a node held at V'. The current flow IN through the input resistor R1 is (Vin−V')/R1 and since the non-inverting input of the amplifier does not source or sink current, a corresponding current is caused to flow though R2 and then through the amplifier output stage the amplifier. Such an arrangement is shown in FIG. 15*b*.

The techniques described hereinbefore can still be used. The feedback current and the load current can be compensated for individually. However in a common use case the voltage that the non-inverting input is connected to is the same voltage that one end of the load resistor is held at, namely a local reference voltage or a local ground voltage, and in this arrangement the load impedance and the resistor R2 appears in parallel at the output of the amplifier with the same voltage drop across them. In which case a compensation resistor 600 can be set to a value $R_{comp}$ equal to the equivalent value of R2 and $R_L$ in parallel, or in the more advantageous case where the value of the compensation resistor is effectively variable, the value of the compensation resistor is variable over a range related to the value of R2 in parallel with $R_L$.

Figure 16:
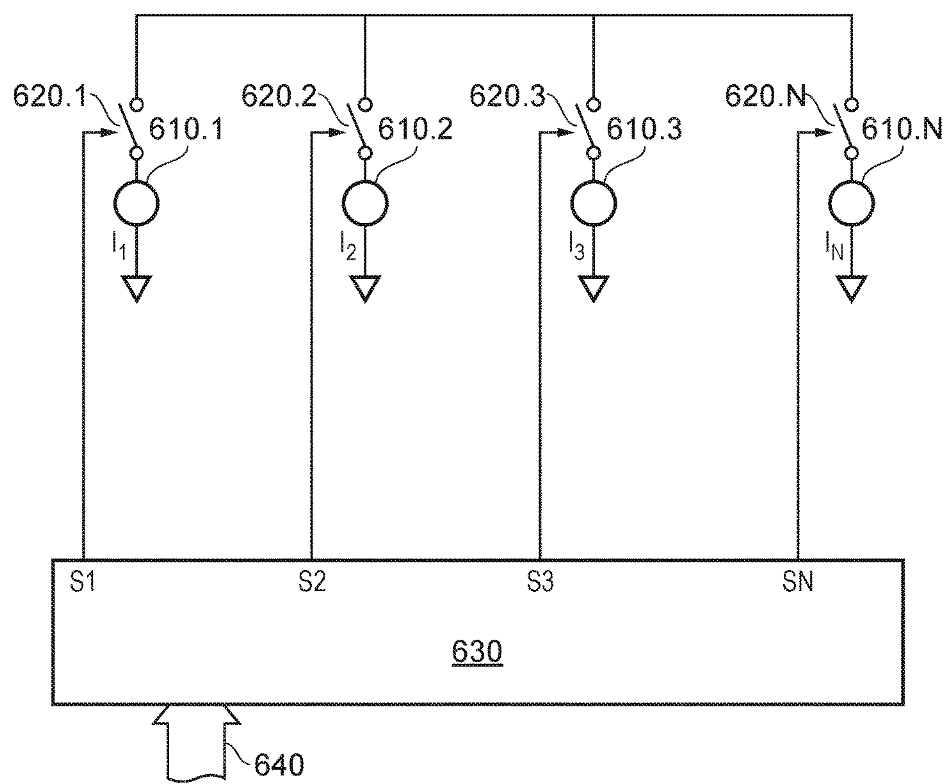
FIG. 16 is a schematic diagram of a digitally controlled compensation circuit in accordance with this disclosure.

The techniques disclosed herein can be implemented in various ways in analog or digital ways. For example where the amplifier is responsive to a DAC, the heat dissipation elements may be formed as an array of current sources 610.1 to 610.N passing currents I1 to IN as shown in FIG. 16. The current flow in each current source may be disabled by switches 620.1 to 620.N. which may be implemented as transistors. The switches are responsive to a controller 630 that provides switch control signals S1 to SN. The switch controller may be responsive to an input word supplied on a data bus 640 The input word may be representative of measured voltage at the output node and hence can be used to switch selected ones of the current sources on such that they dissipate a required amount of heat to a temperature compensate the load resistor and/or the output stage transistors. Where the amplifier is an output stage of an associated DAC, the input work may be the DAC input word.

The teachings of this disclosure help mitigate the effects of self-heating but should be used in conjunction with good layout techniques such as keeping devices whose temperature sensitivity is more significant to the performance of the circuit away from potential disturbances.

It is thus possible to provide an improved integrated circuit where error or distortion due to self-heating is reduced. Noise variation due to current variation can also be reduced. Such integrated circuits can be used in domestic devices, such as Audio visual systems, in automotive devices and in industrial controllers, actuator controllers and healthcare systems. The teachings of the present disclosure can be used in any application where improved linearity in generating or amplifying a signal are desired or where reduced offsets are desired in comparators or amplifiers.

Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and converter functions (or some other desired functions): all of which may be provided on a single chip substrate. Other embodiments may include a multi-chip-module (MCM), with a plurality of separate ICs located within a single electronic package and configured to interact closely with each other through the electronic package.

In certain contexts, the features discussed herein can be applicable to converters being used in many different applications. The features herein are also applicable to other signal processing systems that can be assisted by specialized digital circuitry and/or an on-chip uP. Various exemplary applications include medical systems, scientific instrumentation, transportation systems, aerospace systems, wireless and wired communications, radar, industrial process control, audio and video equipment, consumer devices, and other converter-based systems.

Parts of various apparatuses for providing digitally assisted function can include electronic circuitry to perform the functions described herein. In some cases, one or more parts of the apparatus can be provided by an on-chip uP specially configured for carrying out the functions described herein. For instance, the on-chip uP may include one or more application specific components, or may include programmable logic gates which are configured to carry out the functions describe herein. The circuitry can operate in analog domain, digital domain, or in a mixed signal domain (but preferably in the digital domain). In some instances, the processor may be configured to carrying out the functions described herein by executing one or more instructions stored on a non-transitory computer medium accessible by the on-chip uP.

In one example embodiment, the chip providing the converter and the on-chip uP may be provided on a board of an associated electronic device. The board can be a general circuit board that can hold various components of the internal electronic system of the electronic device and, further, provide connectors for other peripherals. For instance, the chip having the converter and the on-chip uP can communicate with the components of the associated electronic device (e.g., signal generators, processors, memory, transmitters, receivers, etc.) More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures. Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

The claims presented herein are in single dependency format suitable for filing with the United States Patent & Trademark Office, taking account of their fee structure for presenting multiply dependent claims. However, it is to be understood that each claim should be regarded as being dependent on any preceding claim of the same type unless that is clearly technically infeasible.

The invention claimed is:

1. An integrated circuit for adjusting heat dissipation to reduce the effect of temperature variations between a first component of a digital-to-analog converter and a second component of the digital-to-analog converter, the first component and the second component located on the integrated circuit, the temperature variations caused by input-dependent differences in operation between the first component and the second component, the integrated circuit comprising:

- a first current flow path comprising the first component, where current flow through the first component causes heating of the first component, and where the first component has an electrical property that changes as a function of temperature;

a second current flow path comprising the second component;

a heating element in proximity to, but separate from the first component and separate from the first current flow path and the second current flow path; and a controller configured to:

modify a digital input word presented to the digital-to-analog converter to reduce an error in an output value of the digital-to-analog converter, the error due to heating caused by the digital input word; and selectively modulate energy dissipated by the heating element based at least in part on an input to the first component to reduce variations in the electrical property of the first component relative to the second component, the selectively modulating providing heat from the heating element to the first component relative to a second component.

2. An integrated circuit as claimed in claim 1, in which the first component comprises a resistor, and the resistor has a temperature coefficient of resistance (dR/dT) and where the controller is further configured to perform operations comprising selectively modulating the energy dissipated by the heating element in response to current flow through the resistor to control the heating provided by the heating element.

3. An integrated circuit as claimed in claim 1, in which a switch or switches associated with the first current flow path is controlled in response to a digital input word signal to the DAC, and where the controller is further configured to perform operations comprising controlling the heat provided from the heating element to the first component in response to changes in the digital input word signal to the DAC.

4. An integrated circuit as claimed in claim 1, in which the first current flow path is arranged in a first area of semiconductor and the heating element is provided adjacent the first area of semiconductor.

5. An integrated circuit as claimed in claim 1, in which the first current flow path is arranged in a first area of semiconductor, and the heating element is provided in the first area of semiconductor.

6. An integrated circuit as claimed in claim 1, further including a guard area around the first component.

7. An integrated circuit as claimed in claim 1, in which the heating element has a heat dissipation which varies as a function of position within the heating element.

8. An integrated circuit as claimed in claim 2, in which the resistor is components within an analog signal processing circuit.

9. An integrated circuit as claimed in claim 1, in which the current flow path comprises an active device and the controller acts to suppress temperature variation at the active device or acts to suppress the relative temperature variation between a plurality of components.

10. An integrated circuit as claimed in claim 1, in which the controller is further configured to perform operations comprising:

estimating or measuring temperature variation between components; and energizing the heating element to reduce the temperature variation or the impact of variations between components.

11. An integrated circuit as claimed in claim 1, in which the controller is further configured to perform operations comprising:

estimating or measuring parameter variation between components; and energizing the heating element in order to reduce the parameter variation.

12. A method of adjusting heat dissipation and improving precision of an integrated circuit comprising a digital-to-analog converter, the digital-to-analog converter comprising a plurality of components including a first component and a second component, the integrated circuit experiencing temperature differences between the first component and the second component due to input-dependent differences in operation between the first component and the second component, the method comprising:

modify a digital input word presented to the digital-to-analog converter to reduce an error in an output value of the digital-to-analog converter, the error due to heating caused by the digital input word; and selectively modulating energy dissipated by a first heating element based at least in part on an input of the first component, the modulating to provide heat from the first heating element to the first component relative to a second component of the plurality of components to reduce variations in the electrical characteristic of the first component relative to the second component.

13. A method as claimed in claim 12, further comprising estimating, by a controller, an amount of heat required to be supplied to the first heating element within the integrated circuit based on knowledge of the task the integrated circuit is performing.

14. A method as claimed in claim 12, in which the digital-to-analog converter is a resistive digital-to-analog converter and the plurality of components comprise resistors in the digital-to-analog converter, further comprising:

varying a current in a resistor as a function of a digital input word of the digital-to-analog converter; and responsive to the digital input word of the digital-to-analog converter, selectively modulating, by a controller, energy provided by the respective heating elements of the plurality of heating elements associated with respective resistors to reduce temperature or resistance differences between selected ones of the resistors.

15. A method as claimed in claim 14, further comprising controlling energy dissipation so as to modify the variation in current drawn by the digital-to-analog converter in response to changes in the digital input word of the digital-to-analog converter so as to reduce electrical interference created by operation of the digital-to-analog converter.

16. An integrated circuit for adjusting heat dissipation to reduce the effect of temperature variations between a first component and a second component located on the integrated circuit, the temperature variations caused by input-dependent differences in operation between the first component and the second component, the integrated circuit comprising:

a digital-to-analog converter comprising plurality of components, the plurality of components including the first component and the second component, wherein a property of a first component is to be matched to a property of a second component in a predetermined way;

a controller configured to modify a digital input word presented to the digital-to-analog converter to reduce an error in an output value of the digital-to-analog converter, the error due to heating caused by the digital input word; and a temperature control component, separate from the first component and the second component and adjacent at least one of the first component or the second component so as to modify a temperature of the first component by modulating energy dissipated by a heating element based at least in part to an input to the first component to provide modulated heat to the first component so as to reduce mismatch between the first component and second components.

17. An integrated circuit as claimed in claim 16, wherein the property is resistance or conductance of the first and second components.

18. An integrated circuit as claimed in claim 16, wherein the property is current flow through the first and second components.

19. An integrated circuit as claimed in claim 18, wherein the first and second components comprise first and second transistors and the current flow is controlled in response to a given voltage difference between a gate and drain or base and collector, as appropriate, of the first and second transistors.

20. An integrated circuit as claimed in claim 16, wherein the controller is also configured to perform operations comprising controlling the temperature control components in response to measuring or inferring a mismatch in the property of the first and second components.

21. An integrated circuit as claimed in claim 16, wherein the first components are transistors arranged in a differential pair.

22. A digital-to-analog converter comprising:

an array comprising a plurality of resistors and a plurality of switches, wherein the plurality of switches are arranged to control connections to the plurality of resistors in the array in response to a digital input word signal to the digital-to-analog converter;

a heating element positioned to provide heat to a first resistor of the plurality of resistors;

a processor configured to perform operations comprising:

estimating an error resulting from self-heating of resistors in the array of resistors based at least in part on the digital input word;

modulating energy dissipated by the heating element based at least in part on the digital input word, the modulating to reduce variations in an electrical property between the first resistor and a second resistor of the plurality of resistors; and modifying the digital input word signal presented to the switches so as to reduce an error in an output value of the digital-to-analog converter.

23. The digital-to-analog converter of claim 22, in combination with an amplifier in association with a power compensator arranged to reduce the variation on power drawn from a supply, wherein the power compensator draws power from the power supply or from a further power supply, and where the power dissipated by the power compensator is relatively high when the power dissipated by at least one of an amplifier and a load is relatively low, and where the power dissipated by the power compensator is relatively low when the power dissipated by at least one of the amplifier and the load is relatively high.

24. The digital-to-analog converter as claimed in claim 23, in which the power compensator compensates for at least one of power dissipated in a load, power dissipated in a feedback network and power dissipated in an output stage of the amplifier.

25. The digital-to-analog converter as claimed in claim 23, in which the power compensator has a variable power dissipation characteristic.

26. The digital-to-analog converter as claimed in claim 23, in which the power compensator dissipates heat in a resistor or other dissipation component and a value of the resistor or of the dissipation element is variable.

27. The integrated circuit as claimed in claim 1, further comprising:

a power compensator; and an amplifier in association with the power compensator, wherein the amplifier is arranged to reduce the variation on power drawn from a supply, wherein the power compensator draws power from the power supply or from a further power supply, and wherein the power dissipated by the power compensator is relatively high when the power dissipated by at least one of an amplifier and a load is relatively low, and where the power dissipated by the power compensator is relatively low when the power dissipated by at least one of the amplifier and the load is relatively high.

28. The integrated circuit of claim 1 wherein modulating the energy dissipated by the one or more of the heating elements comprises selectively activating or deactivating the one or more heating elements.

29. An integrated circuit comprising:

a heating element for reducing nonlinearities within the integrated circuit;

a digital-to-analog converter in proximity to the heating element, the digital-to-analog converter being configured to receive a digital input word; and a controller configured to perform operations comprising:

modifying a digital input word presented to the digital-to-analog converter to reduce an error in an output value of the digital-to-analog converter, the error due to heating caused by the digital input word; and selectively energizing the heating element based on the digital input word.

30. The integrated circuit of claim 29 wherein the controller is configured to modify the received digital input word and to selectively energize or de-energize the heating elements based on the modified digital input word.

31. The integrated circuit of claim 29 wherein the controller is configured to modify the received digital input word by adding or subtracting a value from the received digital input word.

32. The integrated circuit of claim 31 wherein the controller is configured to modify the received digital input word by adding a value corresponding to a fraction of a range of the digital-to-analog converter.

33. The integrated circuit of claim 31 wherein the controller is configured to modify the received digital input word by adding a value corresponding to approximately half of a range of the digital-to-analog converter.

* * * * *